US012707655B2

(12) United States Patent
Kuo et al.

(10) Patent No.: US 12,707,655 B2
(45) Date of Patent: Aug. 11, 2026

(54) STRUCTURE AND METHOD FOR DEEP TRENCH CAPACITOR WITH REDUCED DEFORMATION

(71) Applicant: Taiwan Semiconductor Manufacturing Company, Ltd., Hsin-Chu (TW)

(72) Inventors: Fu-Chiang Kuo, Hsinchu City (TW); Hsin-Liang Chen, Hsinchu City (TW); Hsin-Li Cheng, Hsinchu (TW); Ting-Chen Hsu, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 478 days.

(21) Appl. No.: 18/319,213

(22) Filed: May 17, 2023

(65) Prior Publication Data

US 2024/0047552 A1 Feb. 8, 2024

Related U.S. Application Data

(60) Provisional application No. 63/395,237, filed on Aug. 4, 2022.

(51) Int. Cl.
*H10P 14/60* (2026.01)
*H10D 1/00* (2025.01)
(Continued)

(52) U.S. Cl.
CPC ............ *H10D 1/047* (2025.01); *H10D 1/665* (2025.01); *H10P 14/6334* (2026.01);
(Continued)

(58) Field of Classification Search
CPC ... H10D 1/041–043; H10D 1/045–048; H10D 1/665; H01L 21/027–0338;
(Continued)

(56) References Cited

U.S. PATENT DOCUMENTS 11,145,564 B2 10/2021 Huang et al.
2003/0148587 A1 * 8/2003 Suzuki ............. H01L 21/76229 257/E21.549
(Continued)

FOREIGN PATENT DOCUMENTS

TW 201913889 A 4/2019
TW 202010045 A 3/2020
(Continued)

*Primary Examiner* — Kevin Parendo
(74) *Attorney, Agent, or Firm* — HAYNES AND BOONE, LLP

(57) ABSTRACT

The present disclosure provides an embodiment of a method. The method includes patterning a substrate to form trenches; etching the substrate, thereby modifying the trenches with round tips; forming a stack including conductive layers and dielectric layers in the trenches, wherein the conductive layers and the dielectric layers alternate with one another within the stack; forming an insulating compressive film in the trenches, thereby sealing voids in the trenches; and forming conductive plugs connected to the conductive layers, respectively.

20 Claims, 31 Drawing Sheets

(51) Int. Cl.

| | |
|---|---|
| ***H10D 1/66*** | (2025.01) |
| ***H10P 14/69*** | (2026.01) |
| ***H10P 14/692*** | (2026.01) |
| ***H10P 14/694*** | (2026.01) |
| ***H10P 76/20*** | (2026.01) |
| ***H10P 76/40*** | (2026.01) |
| ***H10W 20/00*** | (2026.01) |

(52) U.S. Cl.
CPC .... *H10P 14/6905* (2026.01); *H10P 14/69215* (2026.01); *H10P 14/69433* (2026.01); *H10P 76/2041* (2026.01); *H10P 76/405* (2026.01); *H10P 76/408* (2026.01); *H10W 20/069* (2026.01)

(58) Field of Classification Search
CPC ......... H01L 21/02164; H01L 21/31116; H10P 76/00–76/4088; H10P 50/283; H10P 14/69215
See application file for complete search history.

(56) References Cited

U.S. PATENT DOCUMENTS

| | | | | |
|---|---|---|---|---|
| 2017/0345823 | A1* | 11/2017 | Jang | H10B 12/37 |
| 2019/0074349 | A1* | 3/2019 | Lin | H10B 12/37 |
| 2019/0181217 | A1 | 6/2019 | Kang et al. | |
| 2020/0013646 | A1* | 1/2020 | Sasaki | H01L 21/67248 |

FOREIGN PATENT DOCUMENTS

| | | | |
|---|---|---|---|
| TW | 202114235 | A | 4/2021 |
| TW | 202125701 | A | 7/2021 |

* cited by examiner

STRUCTURE AND METHOD FOR DEEP TRENCH CAPACITOR WITH REDUCED DEFORMATION

This application claims priority to U.S. Provisional Patent Application Ser. No. 63/395,237 filed Aug. 4, 2022, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed. For example, a capacitor, as a passive device, is an important device in integrated circuits and is widely used for various purposes, such as in random access memory (RAM) non-volatile memory devices, decoupling capacitor, or RC circuit. When the IC moves to advanced technology nodes with less feature sizes, a capacitor is almost non-shrinkable and cannot be scaled down to small dimensions due to capacitor characteristics. A capacitor takes a significant circuit area penalty. Furthermore, the existing method making a capacitor introduces defects into the capacitor and causes undesired issues, such as stress and induced wafer warpage. Accordingly, it would be desirable to provide a capacitor structure integrated with other circuit devices and a method of manufacturing thereof absent the disadvantages discussed above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
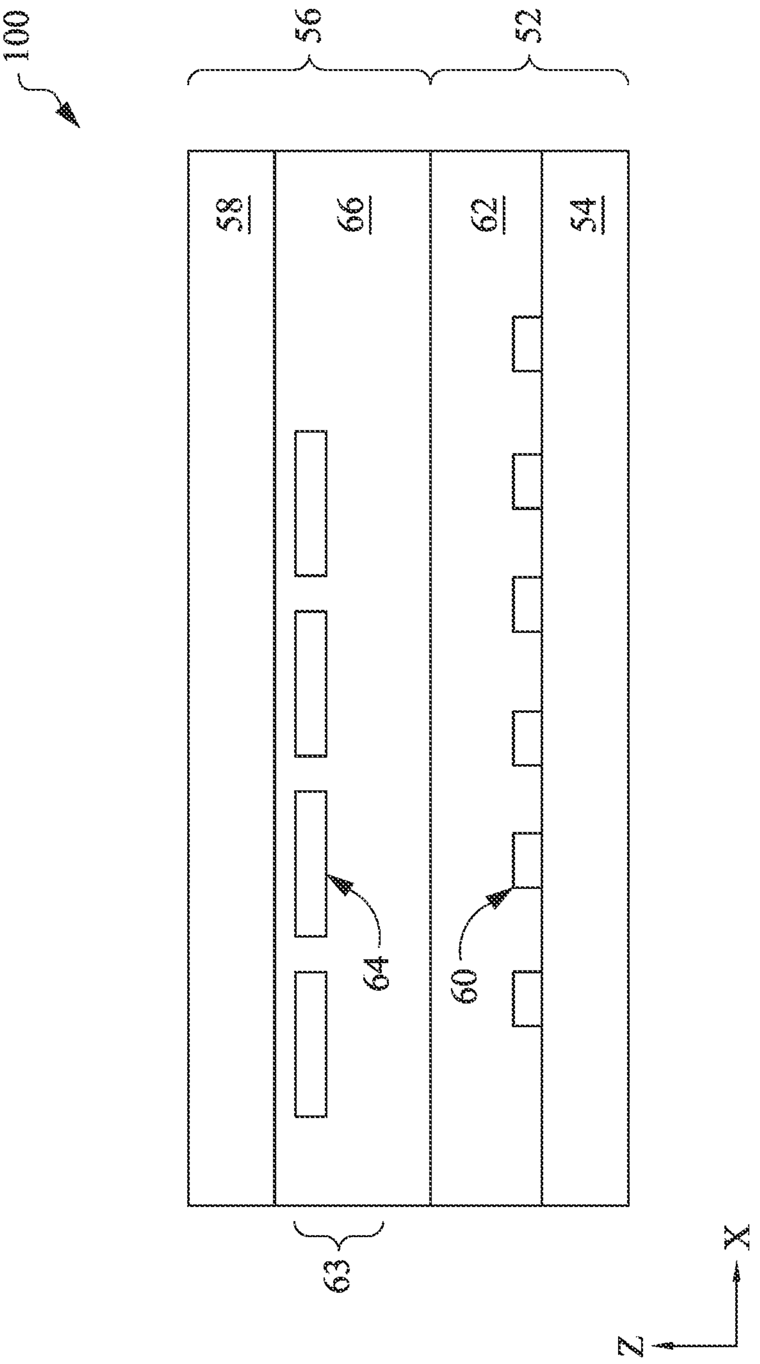
FIG. 1 is a sectional view of an integrated circuit (IC) structure Having a deep trench capacitor, constructed according to some embodiments of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, “lower,” “upper,” “horizontal,” “vertical,” “above,” “over,” “below,” “beneath,” “up,” “down,” “top,” “bottom,” etc. as well as derivatives thereof (e.g., “horizontally,” “downwardly,” “upwardly,” etc.) are used for ease of the present disclosure of one feature relationship to another feature. The spatially relative terms are intended to cover different orientations of the device including the features. Still further, when a number or a range of numbers is described with “about,” “approximate,” and the like, the term is intended to encompass numbers that are within a reasonable range including the number described, such as within +/−10% of the number described, or other values as understood by person skilled in the art. For example, the term “about 5 nm” encompasses the dimension range from 4.5 nm to 5.5 nm.

The present disclosure relates generally to an integrated circuit (IC) structure and a method making the same, and more particularly, to a deep-trench capacitor device integrated with other devices to form a three-dimensional (3D) IC structure. The IC structure further includes other devices, such as field-effect transistors (FETs), fin-like FETs (FinFETs), and other multi-gate devices. In some examples, the multi-gate devices include gate-all-around (GAA) devices.

FIG. 1 is a sectional view of an IC structure 100, constructed in accordance with some embodiments of the present disclosure. The IC structure 100 includes a first circuit structure 52 formed on a first substrate 54 and a second circuit structure 56 formed on a second substrate 58. The first circuit structure 52 and the second circuit structure 56 are bonded together to form a 3D IC structure, by a suitable bonding technology, such as wafer level packaging, wafer chip-scale packaging, or fan out wafer-level package technology. The first circuit structure 52 and the second circuit structure 56 are electrically coupled into an integrated circuit by a suitable technology, such as hybrid bonding layer, through-semiconductor via (TSV), other suitable coupling technologies, or a combination thereof.

Particularly, the substrate (first substrate 54 or the second substrate 58) may include a semiconductor substrate, such as a silicon substrate. The semiconductor substrate may alternatively include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate (54 or 58) may also include a semiconductor-on-insulator substrate, such as Si-on-insulator (SOI), SiGe-on-insulator (SGOI), Ge-on-insulator (GOI) substrates. Portions of the substrate may be doped, such as doped with p-type dopants (e.g., boron (B) or boron fluoride ($BF_3$)), or doped with n-type dopants (e.g., phosphorus (P) or arsenic (As)). The doped portions may also be doped with combinations of p-type and n-type dopants (e.g., to form a p-type well and an adjacent n-type well). The doped portions may be formed directly on the substrate, in a p-well structure, in an n-well structure, in a dual-well structure, or using a raised structure.

The first and second substrates 54 and 58 each include a frontside surface and a backside surface spanning along X and Y directions with a normal direction along Z direction. The X, Y and Z directions are perpendicular with each other. The first circuit structure 52 and the second circuit structure 56 are bonded together through the frontside surface of the first substrate 54 to the frontside surface of the second substrate 58, the frontside surface of the first substrate 54 to the backside surface of the second substrate 58, hybrid bonding layer, an interposer, or other configurations, depending on individual applications.

The first circuit structure 52 includes various devices 60 formed on the first substrate 54. The devices 60 include FETs, FinFETs, GAA devices, other multi-gate devices or a combination thereof. The first circuit structure 52 further includes an interconnect structure 62 coupling the devices 60 into a first circuit, such as a digital circuit, memory circuit, analog circuit, or a combination thereof.

The second circuit structure 56 includes various devices 63 formed on the second substrate 58. The devices 63 may include various devices, such as high-frequency devices, imaging sensor circuit, passive devices (e.g., capacitors and inductors), micro-electromechanical systems (MEMS) devices, or a combination thereof. The second circuit structure 56 further includes an interconnect structure 66 coupling the devices 63 into a second circuit, which is coupled with the first circuit formed on the first substrate 54. Particularly, the devices 63 formed in the second circuit structure 56 include a deep trench capacitor (DTC) structure 64 including one or more deep trench capacitor. A deep trench capacitor includes a plurality of conductive material layers and dielectric material layers alternatively stacked and folded into one or more deep trenches to increase capacitance. The IC structure 100 including a DTC structure 64 and the method making the same are further described below in detail.

Figure 2:
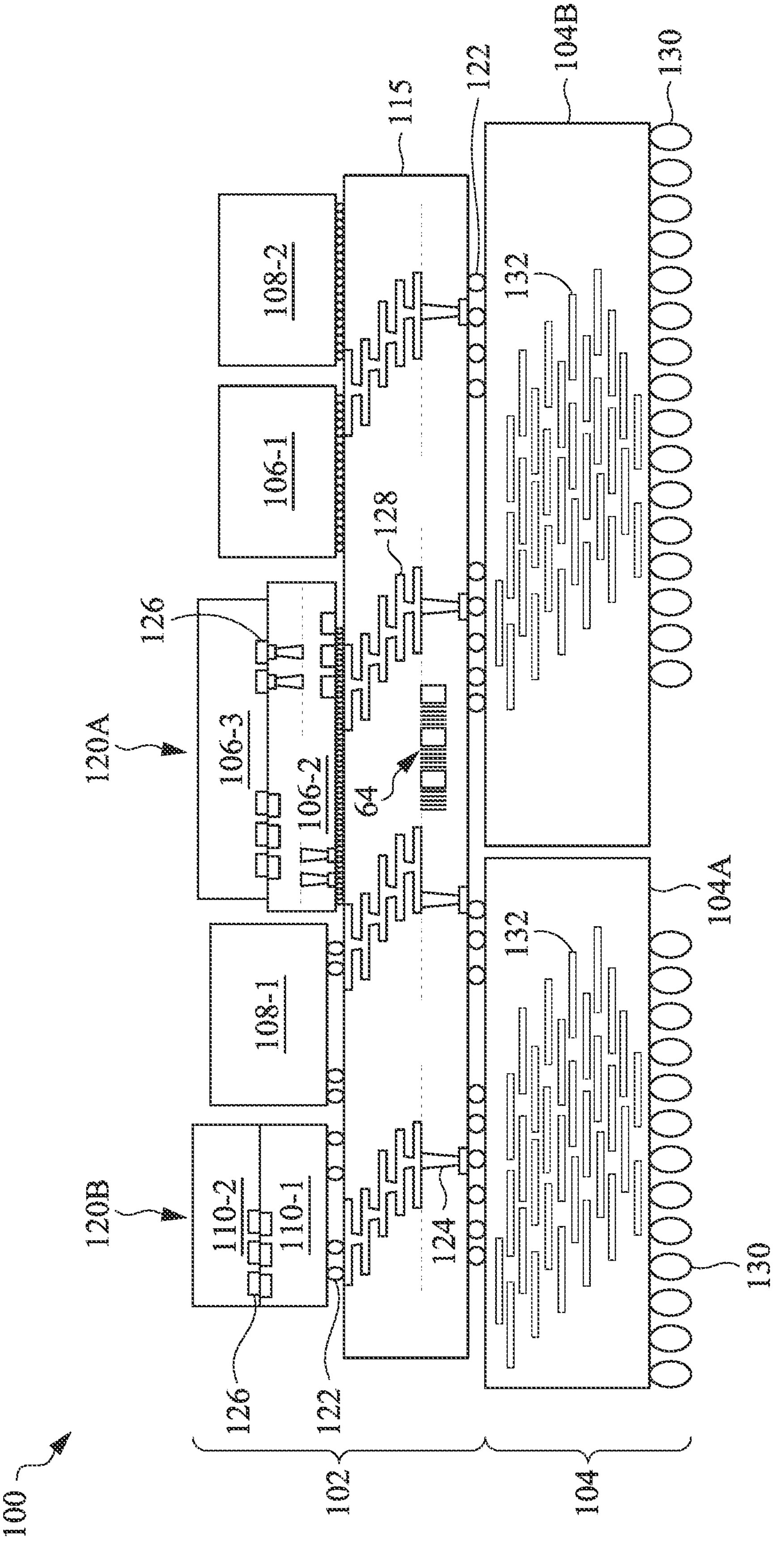
FIG. 2 is a sectional view of an IC structure having a deep trench capacitor, constructed according to some embodiments of the present disclosure.

FIG. 2 is a fragmentary cross-sectional view of the IC structure 100, in portion or entirety, that is provided by arranging a chipset using a combination of multichip packaging technologies, such as chip-on-wafer-on-substrate (CoWoS) packaging technology, system-on-integrated-chips (SoIC) multi-chip packaging technology, an integrated-fan-out (InFO) package, according to various aspects of the present disclosure. The IC structure 100, which can be referred to as a 3D IC package and/or a 3D IC module, includes a CoW structure 102 attached to a substrate 104 (e.g., a package substrate), which includes a package component 104A and a package component 104B in the depicted embodiment. CoW structure 102 includes a chipset (e.g., a core chip 106-1, a core chip 106-2, a core chip 106-3, a memory chip 108-1, a memory chip 108-2, an input/output (I/O) chip 110-1, and an I/O chip 110-2 electrically connected to each other) attached to an interposer 115. The chipset is arranged into at least one chip stack, such as a chip stack 120A and a chip stack 120B. Chip stack 120A includes core chip 106-2 and core chip 106-3, and chip stack 120B includes I/O chip 110-1 and I/O chip 110-2. In the depicted embodiment, chips of chip stack 120A and chip stack 120B are directly bonded face-to-face and/or face-to-back to provide SoIC packages of multichip package. In some embodiments, a chip stack of multichip package includes a combination of chip types, such as a core chip having one or more memory chips disposed thereover. FIG. 2 has been simplified for the sake of clarity to better understand the inventive concepts of the present disclosure. Additional features can be added in multichip package, and some of the features described below can be replaced, modified, or eliminated in other embodiments of multichip package.

Core chip 106-1, core chip 106-2, and core chip 106-3 are central processing unit (CPU) chips and/or other chips. In some embodiments, core chip 106-1 is a CPU chip that forms at least a portion of CPU cluster, and core chip 106-2 and core chip 106-3 are GPU chips. In some embodiments, core chip 106-1, core chip 106-2, core chip 106-3, or combinations thereof represent a stack of CPU dies, which can be bonded and/or encapsulated in a manner that provides a CPU package and/or a CPU-based SoIC package. In some embodiments, core chip 106-1, core chip 106-2, core chip 106-3, or combinations thereof represent a stack of dies, which can be bonded and/or encapsulated in a manner that provides a GPU package and/or a SoIC package (e.g., a GPU-based SoIC package). In some embodiments, core chip 106-1, core chip 106-2, core chip 106-3, or combinations thereof represent a stack of CPU dies, which can be bonded and/or encapsulated in a manner that provides a core package and/or a core-based SoIC package. In some embodiments, core chip 106-1, core chip 106-2, core chip 106-3, or combinations thereof are SoCs.

Memory chip 108-1 and memory chip 108-2 are high bandwidth memory (HBM) chips, GDDR memory chips, dynamic random-access memory (DRAM) chips, static random-access memory (SRAM) chips, magneto-resistive random-access memory (MRAM) chips, resistive random-access memory (RRAM) chips, other suitable memory chips, or combinations thereof. In some embodiments, memory chip 108-1 and memory chip 108-2 are HBM chips that form at least a portion of the memory device. In some embodiments, memory chip 108-1 and memory chip 108-2 are a graphics double-data rate (GDDR) memory chips that form at least a portion of the memory device. In some embodiments, memory chip 108-1 is an HBM chip and memory chip 108-2 is a GDDR memory chip, or vice versa, that form at least a portion of the memory device. In some embodiments, memory chip 108-1 and/or memory chip 108-2 represent a stack of memory dies, which can be bonded and/or encapsulated in a manner that provides a memory package and/or a memory-based SoIC package. The memory package may be an HBM package (also referred to as an HBM cube) or a GDDR memory package.

Core chip 106-1, core chip 106-2 (and thus chip stack 120A), memory chip 108-1, memory chip 108-2, and I/O chip 110-1 (and thus chip stack 120B) are attached and/or interconnected to interposer 115. Interposer 115 is attached and/or interconnected to substrate 104. Various bonding mechanisms can be implemented in multichip package, such as electrically conductive bumps 122 (e.g., metal bumps), through semiconductor vias (TSVs) 124, bonding pads 126, or combinations thereof. For example, electrically conductive bumps 122 physically and/or electrically connect core chip 106-1, core chip 106-2 (and thus chip stack 120A), memory chip 108-1, memory chip 108-2, and I/O chip 110-1 (and thus chip stack 120B) to interposer 115. Electrically conductive bumps 122 and TSVs 124 physically and/or electrically connect interposer 115 to substrate 104. TSVs 124 of interposer 115 are electrically connected to electrically conductive bumps 122 of chips and/or chip stacks of CoW structure 102 through electrically conductive routing structures (paths) 128 of interposer 115. Bonding pads 126 physically and/or electrically connect core chip 106-2 and core chip 106-3 of chip stack 120A and I/O chip 110-1 and I/O chip 110-2 of chip stack 120B. Also, dielectric bonding layers adjacent to bonding pads 126 can physically and/or electrically connect core chip 106-2 and core chip 106-3 of chip stack 120A and/or I/O chip 110-1 and I/O chip 110-2 of chip stack 120B. In some embodiments, electrically conductive bumps 122 that connect chips and/or chip stacks to interposer 115 may be microbumps, while electrically conductive bumps 122 that connect interposer 115 to substrate 104 may be controlled collapse chip connections (referred to as C4 bonds) (e.g., solder bumps and/or solder balls).

In some embodiments, substrate 104 is a package substrate, such as coreless substrate or a substrate with a core, that may be physically and/or electrically connected to another component by electrical connectors 130. Electrical connectors 130 are electrically connected to electrically conductive bumps 122 of interposer 115 through electrically conductive routing structures (paths) 132 of substrate 104. In some embodiments, package component 104A and package component 104B are portions of a single package substrate. In some embodiments, package component 104A and package component 104B are separate package substrates arranged side-by-side. In some embodiments, substrate 104 is an interposer. In some embodiments, substrate 104 is a printed circuit board (PCB).

In some embodiments, interposer 115 is a semiconductor substrate, such as a silicon wafer (which may generally be referred to as a silicon interposer). In some embodiments, interposer 115 is laminate substrate, a cored package substrate, a coreless package substrate, or the like. In some embodiments, interposer 115 can include an organic dielectric material, such as a polymer, which may include polyimide, polybenzoxazole (PBO), benzocyclobutene (BCB), other suitable polymer-based material, or combinations thereof. In some embodiments, redistribution lines (layers) (RDLs) can be formed in interposer 115, such as within the organic dielectric material(s) of interposer 115. RDLs may form a portion of electrically conductive routing structures 128 of interposer 115. In some embodiments, RDLs electrically connect bond pads on one side of interposer 115 (e.g., top side of interposer 115 having chipset attached thereto) to bond pads on another side of interposer 115 (e.g., bottom side of interposer 115 attached to substrate 104). In some embodiments, RDLs electrically connect bond pads on the top side of interposer 115, which may electrically connect chips of the chipset. In the disclosed embodiment, one or more deep trench capacitor may be embedded in interposer 115.

In some embodiments, multichip package can be configured as a 2.5D IC package and/or a 2.5D IC module by rearranging the chipset, such that each chip is bonded and/or attached to interposer 115. In other words, the 2.5D IC module does not include a chip stack, such as chip stack 120A and chip stack 120B, and chips of the chipset are arranged in a single plane. In such embodiments, core chip 106-3 and I/O chip 110-2 are electrically and/or physically connected to interposer by electrically conductive bumps 122.

Figure 3:
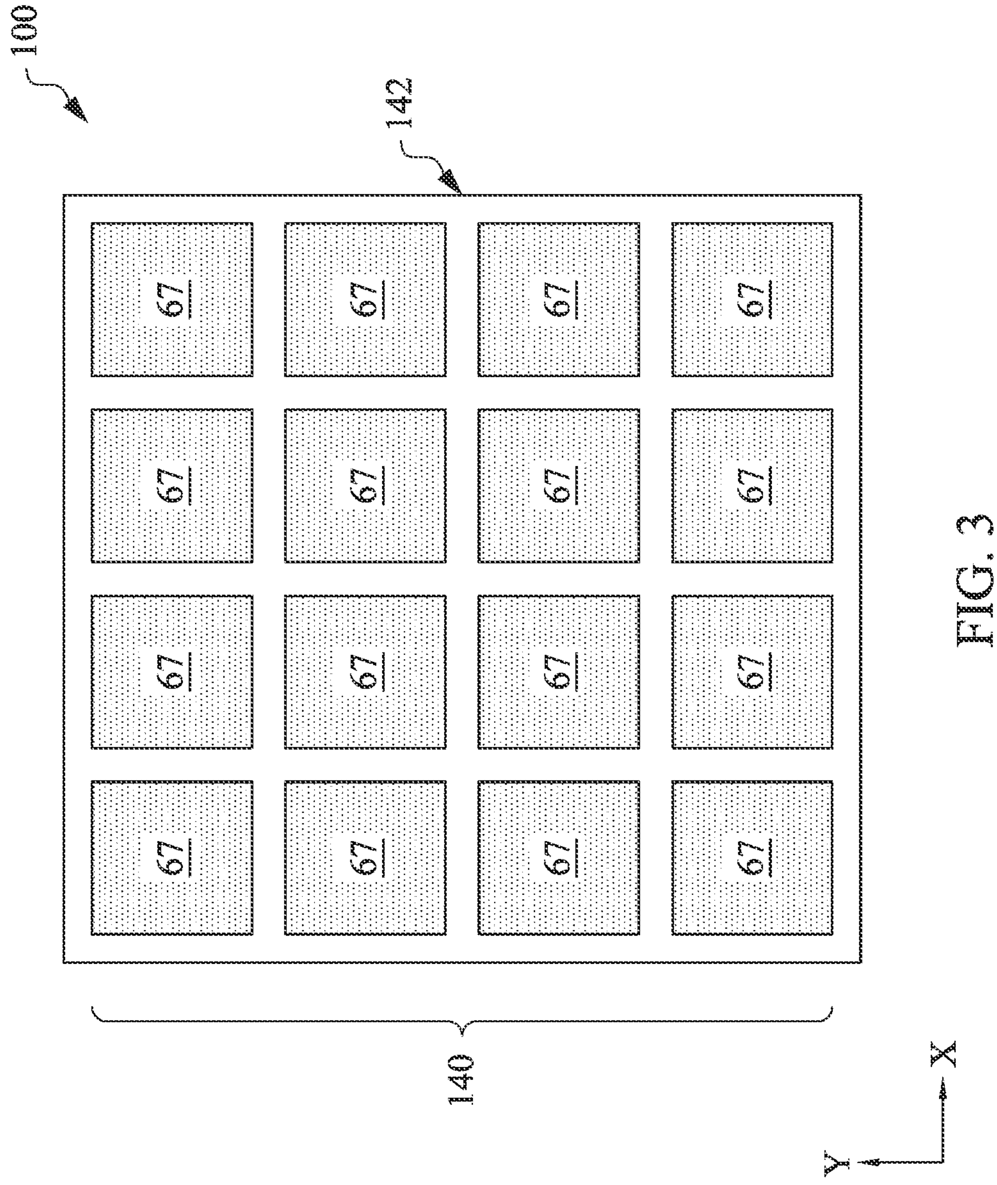
FIG. 3 is a top view of an array of deep trench capacitors, constructed according to some embodiments of the present disclosure.

FIG. 3 is a fragmentary top view of the IC structure 100, in portion or entirety, constructed in accordance with some embodiments of the present disclosure. Particularly, the IC structure 100 includes a deep trench capacitor (DTC) structure 64 having one or more deep trench capacitors configured in a two-dimensional array 140 of DTC unit cells 67. In various embodiments, one or more DTC unit cells 67 are connected into one capacitor, depending on individual applications. Deep trench capacitor structure 64 is formed on a substrate 142, such as a semiconductor substrate. The DTC structure 64 and the method making the same are further described below with other figures.

Figure 4A:
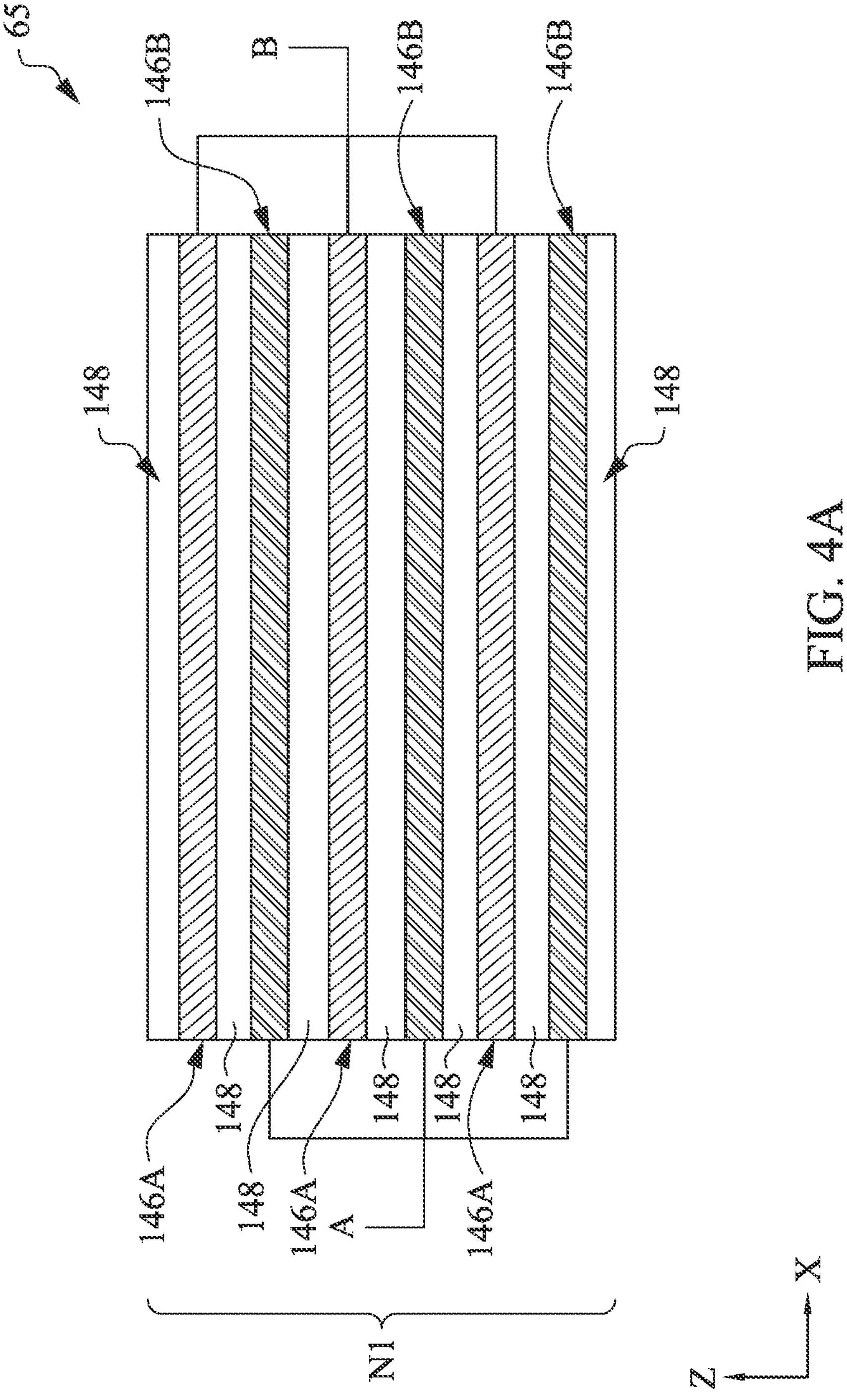
FIG. 4A is a schematic view of a deep trench capacitor, constructed according to some embodiments of the present disclosure.
Figure 4B:
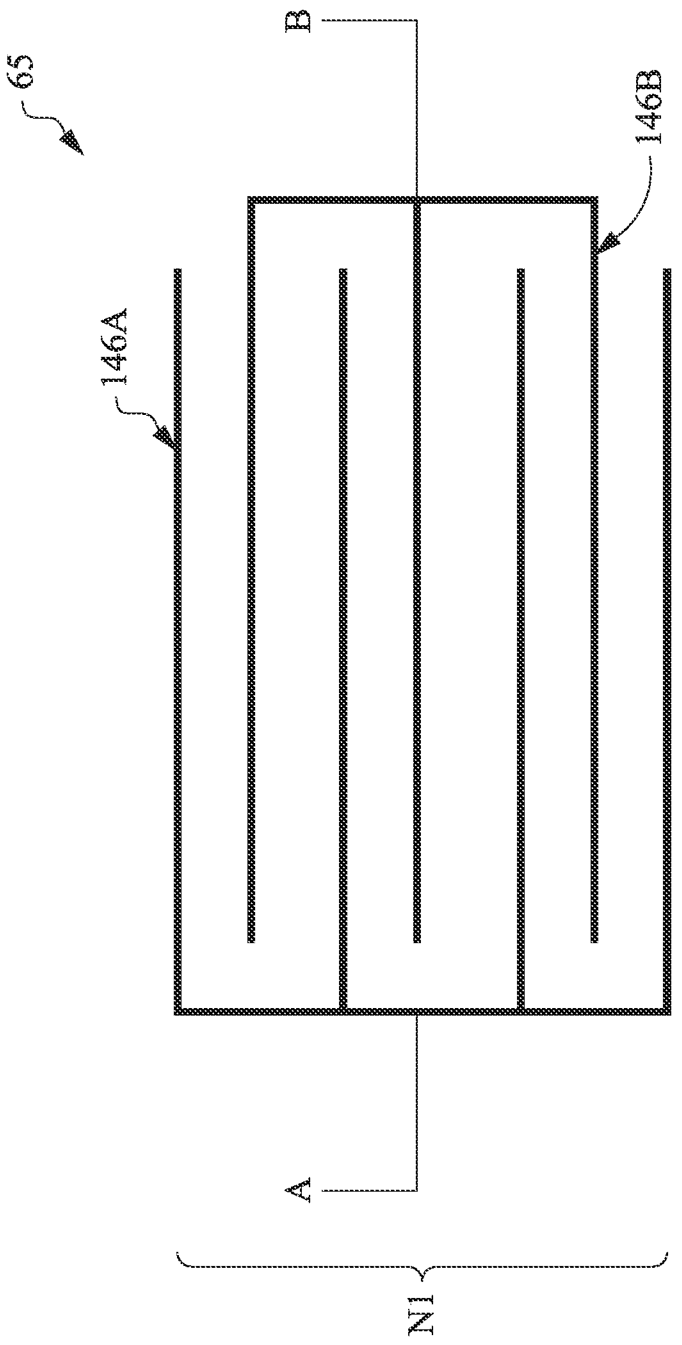
FIG. 4B is a schematic view of a deep trench capacitor, constructed according to some embodiments of the present disclosure.

FIG. 4A is a fragmentary sectional view of the IC structure 100, in portion or entirety, constructed in accordance with some embodiments of the present disclosure. Particularly, one deep trench capacitor 65 is illustrated. The deep trench capacitor 65 includes a stack of a plurality of conductive layers 146 and a plurality of dielectric layers 148 alternatively stacked to form an interleaved capacitor. FIG. 4B further illustrates a schematic view of an interleaved capacitor 65. The conductive layers 146 are grouped into first conductive layers 146A and second conductive layers 146B. The first conductive layers 146A are connected to form a first electrode A and the second conductive layers 146B are connected to form a second electrode B. The first electrode A and the second conductive layers 146B are interleaved. If the number of conductive layers 146, including 146A and 146B, is N1, the total capacitance of the interleaved capacitor 65 is $C=\varepsilon A/d\,(N1-1)$, in which ε is the permittivity of the dielectric layers 148; A is the area of each conductive layer 146; and d is the distance of the adjacent conductive layers or thickness of one dielectric layer 148. From the above formula, increasing the permittivity of the dielectric layers 148 and increasing the areas of the conductive layers 146 effectively increase the capacitance of the interleaved capacitor 65. As stated above, to increase the capacitance of the interleaved capacitor 65, one or more high-k dielectric material is employed to form the dielectric layers 148. To further increase the capacitance of the interleaved capacitor 65, the stack of the conductive layers 146 and the dielectric layers 148 are folded into deep trenches to increase the areas of the conductive layers 146 without increasing the packing area of the deep trench capacitor 65 on the substrate 142, which will be further described later. The DTC structure 64 may include one or more deep trench capacitors 65. One deep trench capacitor 65 may be distributed in one or more DTC unit cells 67.

The conductive layers 146 include metal, metal alloy, silicide, other conductive material, or a combination thereof. In some embodiments, the conductive layers 146 includes titanium nitride (TiN), deposited by physical vapor deposition (PVD), other suitable deposition method or a combination thereof. The dielectric layers 148 function as dielectric medium of the capacitor and include high-k dielectric material, low-k dielectric material, silicon oxide, silicon nitride, silicon oxynitride, or a combination thereof. In the disclosed embodiment, the dielectric layers 148 include a high-k dielectric material, other suitable dielectric material or a combination thereof. A high-k dielectric material is a dielectric material with a dielectric constant greater than that of the thermal silicon oxide. In various embodiments, the high-k dielectric material includes metal oxides, metal nitrides, metal silicates, transition metal-oxides, transition metal-nitrides, transition metal-silicates, oxynitrides of metals. In furtherance of the embodiments, the high-k dielectric material includes metal aluminates, zirconium silicate, zirconium aluminate, $HfO_2$, $ZrO_2$, $ZrO_xN_y$, $HfO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $PbTiO_3$, $BaTiO_3$, $SrTiO_3$, $PbZrO_3$, other suitable high-k dielectric material or a combination thereof. In various examples, the method to form a high-k dielectric material film includes vapor phase deposition (CVD), metal organic chemical vapor phase deposition (MOCVD), PVD, atomic layer deposition (ALD), molecular beam epitaxy (MBE), other suitable technique, or a combination thereof. In another example, the high-k dielectric material may be formed by UV-Ozone Oxidation, which includes sputtering metal film; and oxidation by in-situ of metal film by $O_2$ in presence of UV light.

Figure 5:
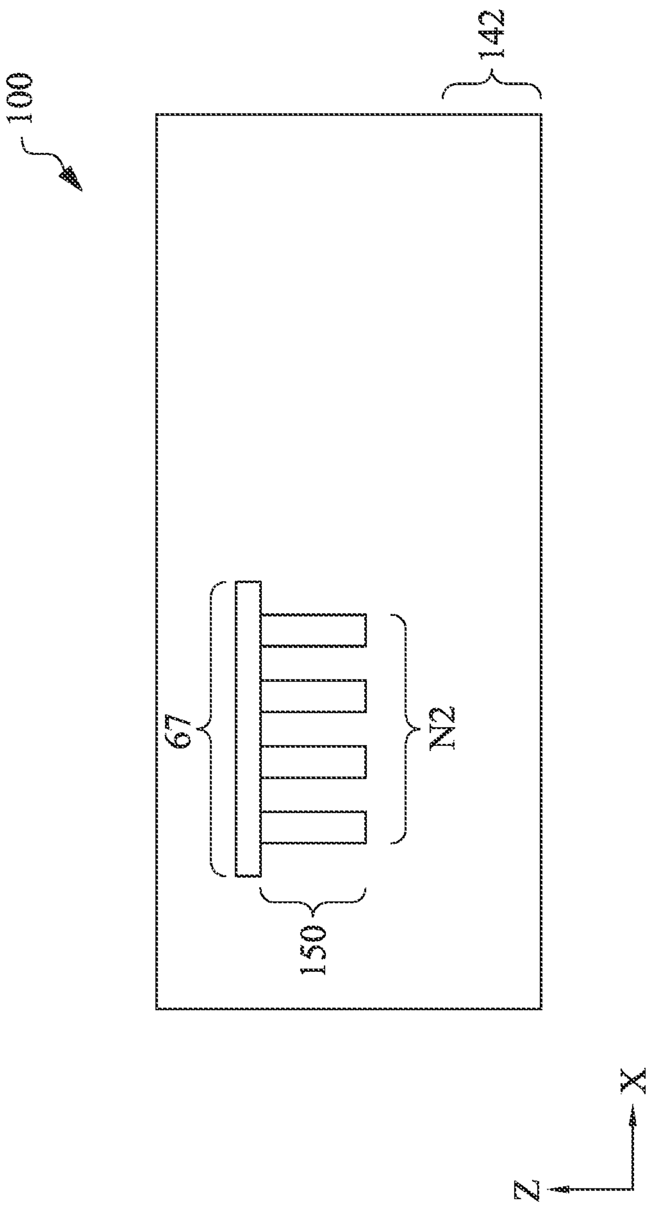
FIG. 5 is a sectional view of a deep trench capacitor, constructed according to some embodiments of the present disclosure.

FIG. 5 is a fragmentary sectional view of the IC structure 100, in portion or entirety, constructed in accordance with some embodiments of the present disclosure. Particularly, one DTC unit cell 67 is illustrated. In the illustrated embodiment, one DTC unit cell 67 is configured into one deep trench capacitor 65. In alternative embodiments, one DTC unit cell 67 is configured as a portion of a deep trench capacitor 65. The stack of the conductive layers 146 and the dielectric layers 148 are folded and inserted into a number of deep trenches 150. Accordingly, the disclosed capacitor is referred to as deep trench capacitor (DTC) 65. The number of the trenches occupied by the capacitor 65 is N2. Increasing N1, N2 or both will increase the capacitance of the capacitor 65.

Figure 6A:
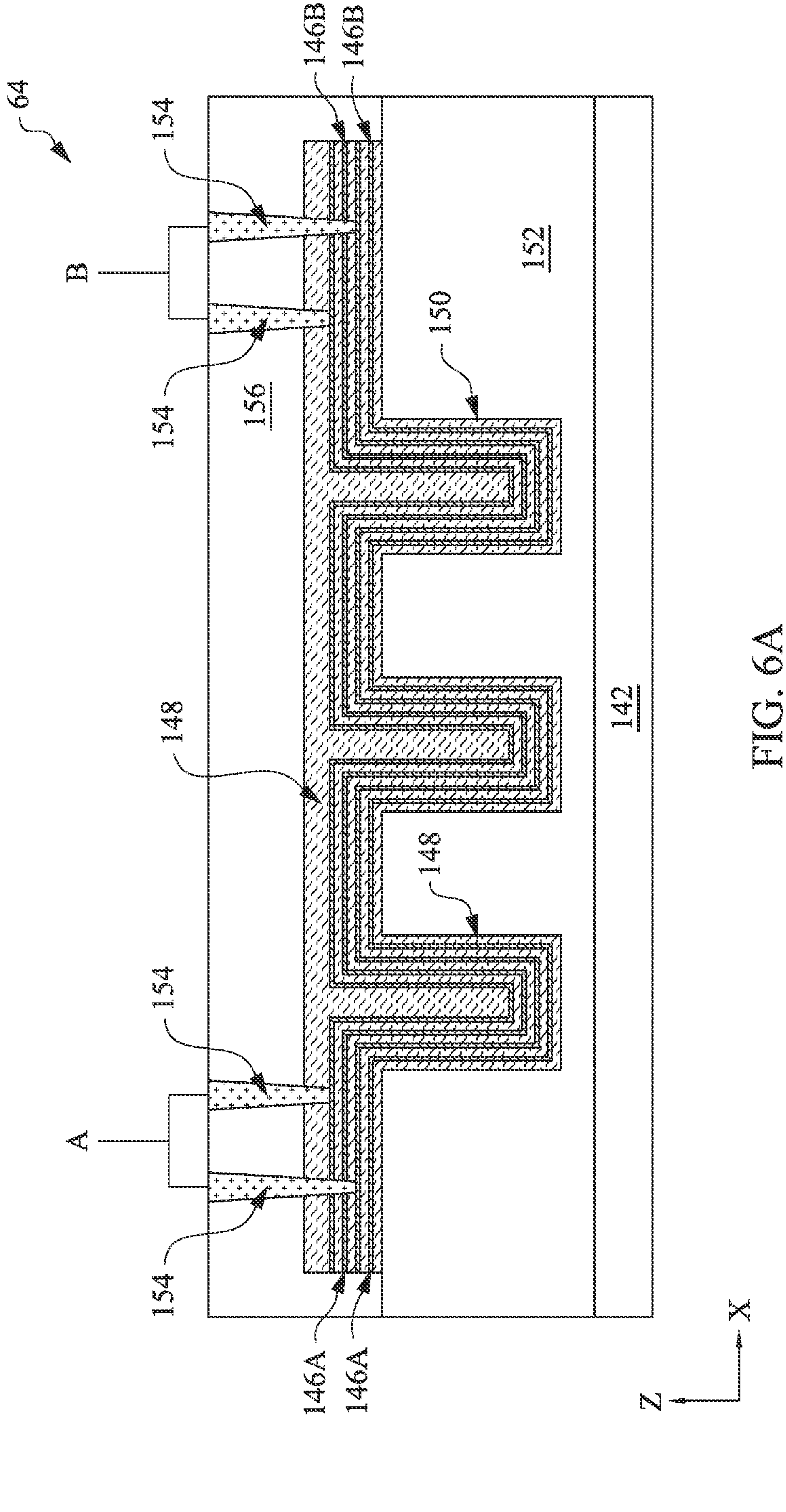
FIGS. 6A, 6B, 6C and 6D are sectional views of a deep trench capacitor, constructed at various fabrication stages according to various embodiments of the present disclosure.

FIG. 6A is a fragmentary sectional view of the IC structure 100, in portion or entirety, constructed in accordance with some embodiments of the present disclosure. Particularly, a DTC structure 64 is illustrated. The stack of the conductive layers 146 and the dielectric layers 148 are folded and inserted into deep trenches 150. In the illustrated embodiment, the DTC structure 64 includes four conductive layers 146 and is formed in three deep trenches 150, in which case, N1=4 and N2=3. It is understood that N1 and N2 can be any suitable integers within the scope of the present disclosure.

In FIG. 6A and other followings figures, the DTC structure 64 only illustrates one DTC unit cell that may be configured into one capacitor or a portion of one capacitor, depending on electrical connections (such as conductive layers 146 and conductive plugs 154, which will be described later). The DTC unit cell 67 is defined as a structure that includes a plurality of deep trenches configured in an area and longitudinally oriented in a same direction. The deep trenches in adjacent DTC unit cells are not connected, such as those illustrated in FIG. 3. Furthermore, the conductive layers 146 of the deep trenches 150 in the same DTC unit cell are continuously extended and connected. As stated above, the DTC structure may include a plurality of deep trench capacitors 65, each deep trench capacitor 65 may be distributed in one or more DTC unit cells 67.

Specifically, the DTC structure 64 is formed on a substrate 142, such as a semiconductor substrate and may further include one or more dielectric material layer 152, such as an interlayer dielectric (ILD) layer deposited on the substrate 142. The dielectric material layer 152 may include silicon oxide, silicon nitride, low k dielectric material, other suitable dielectric material or a combination thereof. Deep trenches 150 are formed in the dielectric material layer 152.

The stack of the conductive layers 146 and the dielectric layers 148 are folded and inserted into deep trenches 150 and is further extended above the trenches, such as over the dielectric material layer 152. The stack is further patterned so that the DTC structure 64 is constrained in a local area of a DTC unit cell without interference with adjacent DTC unit cells. In alternative embodiments where deep trenches in multiple DTC unit cells are configured to form one capacitor, the stack is patterned so that the conductive layers 146 in those DTC unit cells are connected.

Figure 6B:
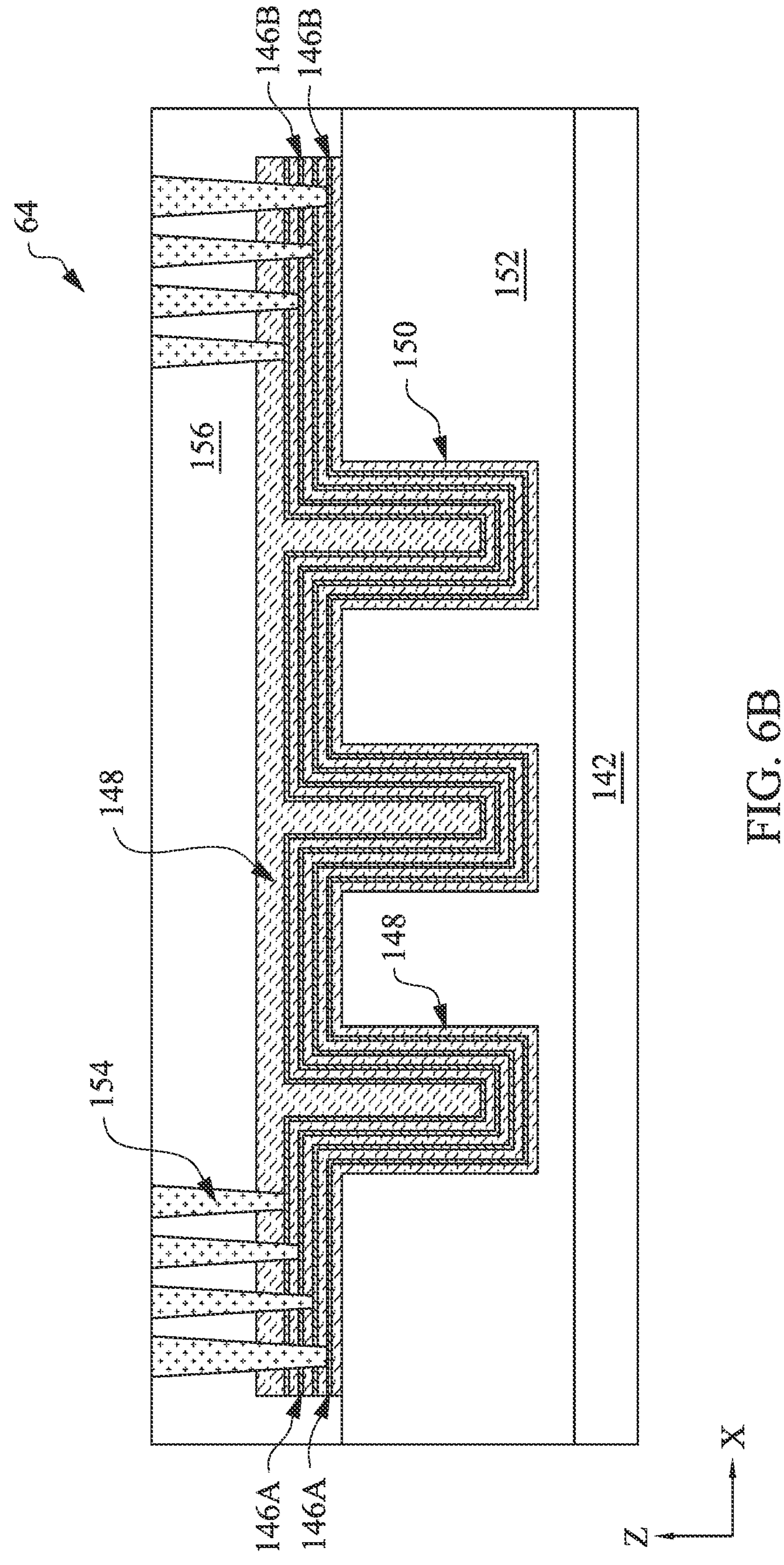
Figure 6C:
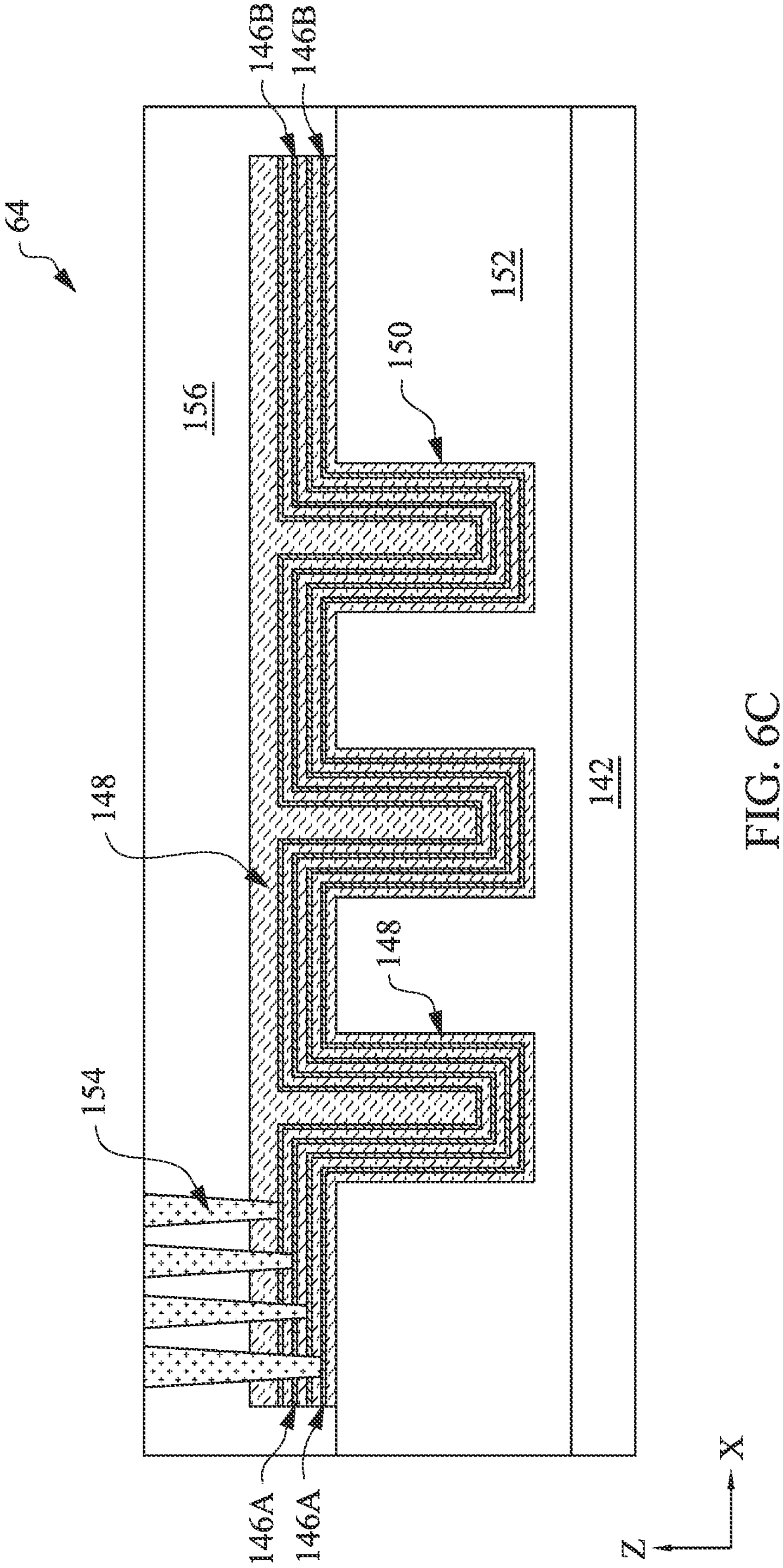
Figure 6D:
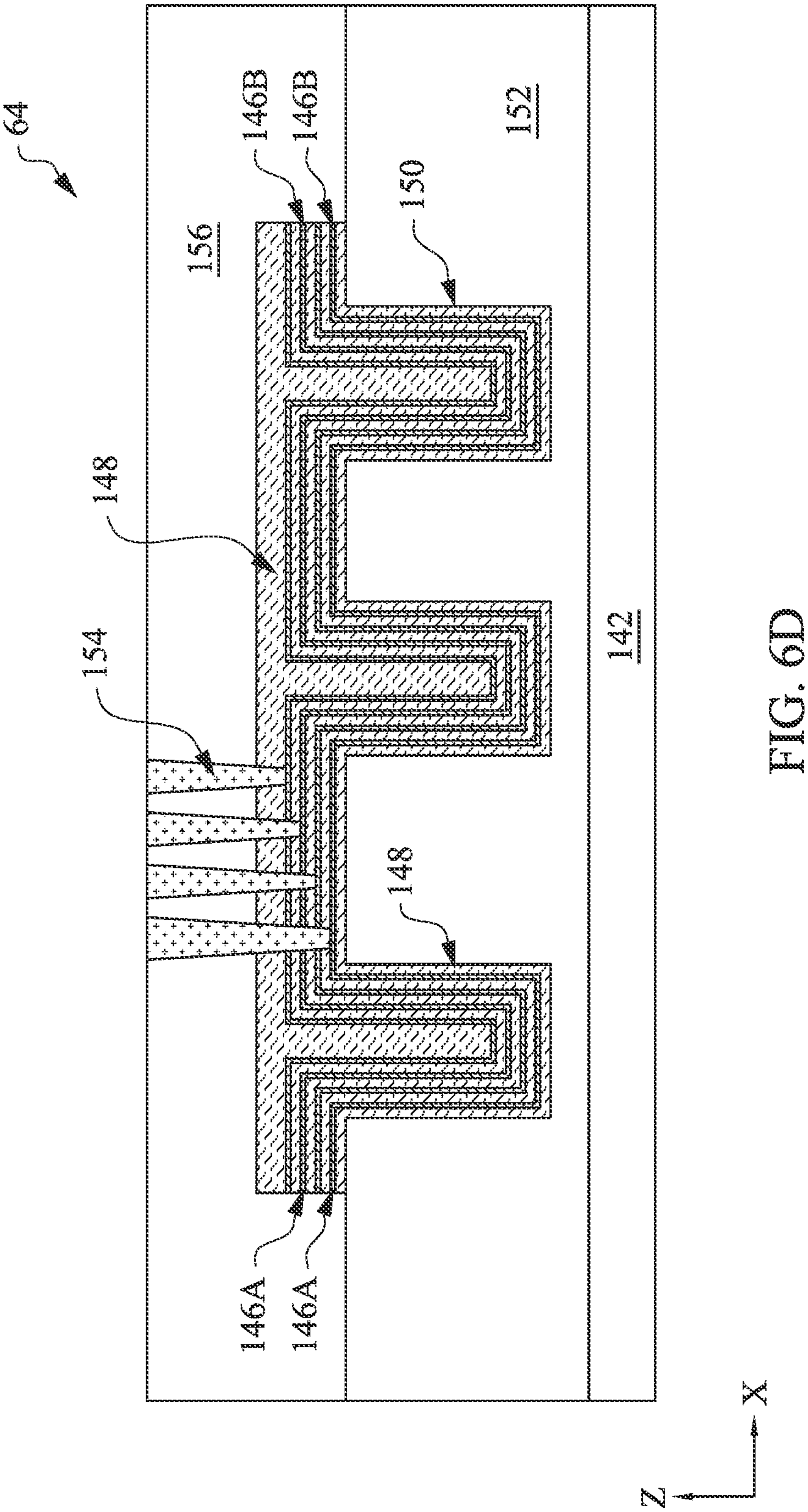

The conductive plugs 154 are formed in another dielectric material layer 156 and are landing on respective conductive layers 146 including 146A and 146B. The conductive plugs landing the conductive layers 146A are electrically connected, such as through an interconnect structure, to form the first electrode A and the conductive plugs landing the conductive layers 146B are electrically connected to form the second electrode B. The dielectric material layer 156 may include silicon oxide, silicon nitride, low k dielectric material, other suitable dielectric material or a combination thereof. In the disclosed embodiment, the dielectric material layer 156 includes undoped silica glass (USG) deposited by CVD, other suitable deposition or a combination thereof. The conductive plugs 154 include aluminum, copper, tungsten, other suitable metal, metal alloy or a combination thereof. In the disclosed method, the conductive plugs 154 include multiple conductive layers designed to address various issues. Especially, a dielectric material layer is surrounding sidewalls of each conductive plug 154 so to provide isolation from intervening conductive layers 146. In some embodiments, dielectric spacers may be further formed on sidewalls of the conductive plugs 154 so to provide various functions including adhesions and prevention of interdiffusion. In some embodiments, a barrier layer, such as titanium and titanium nitride, or tantalum and tantalum nitride may be formed on sidewalls of the conductive plugs 154 to prevent interdiffusion. The conductive plugs 154 may have different configurations, such as landing on the extended stack on both sides as illustrated in FIG. 6B, landing on the extended stack on one side as illustrated in FIG. 6C, landing on the extended stack between two adjacent deep trenches 150 as illustrated in FIG. 6D, or other configurations, such as a subset landing on the extended stack between the deep trenches and another subset landing on the extended stack on either side or both sides. The DTC structure 64 may include other features, such as one or more dielectric material with respective compositions formed in different configuration, such as one additional dielectric layer formed in the deep trenches 150.

Figure 7A:
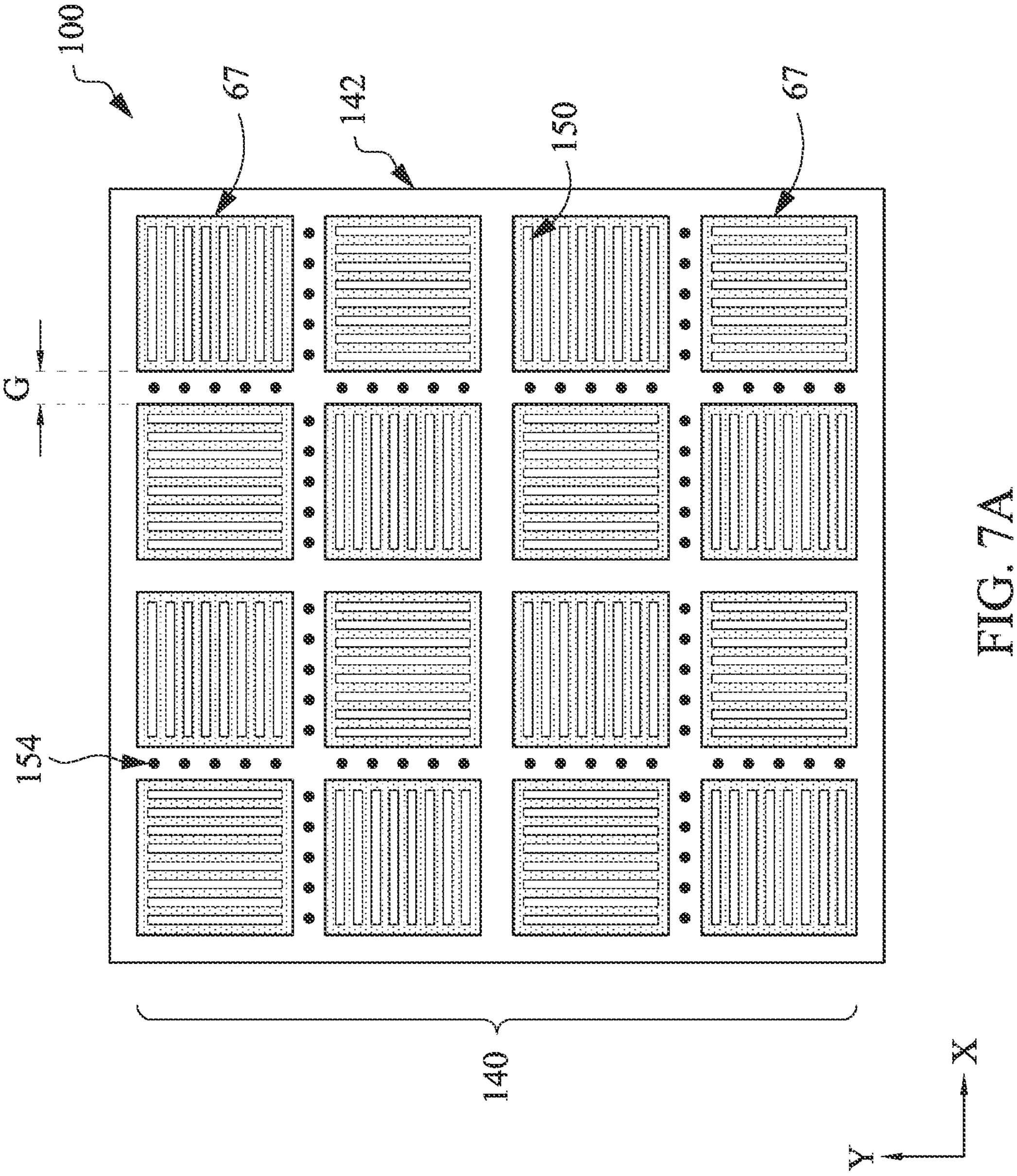
FIGS. 7A, 7B, 7C, 7D and 7E are top views of an array of deep trench capacitors, constructed according to various embodiments of the present disclosure.
Figure 7B:
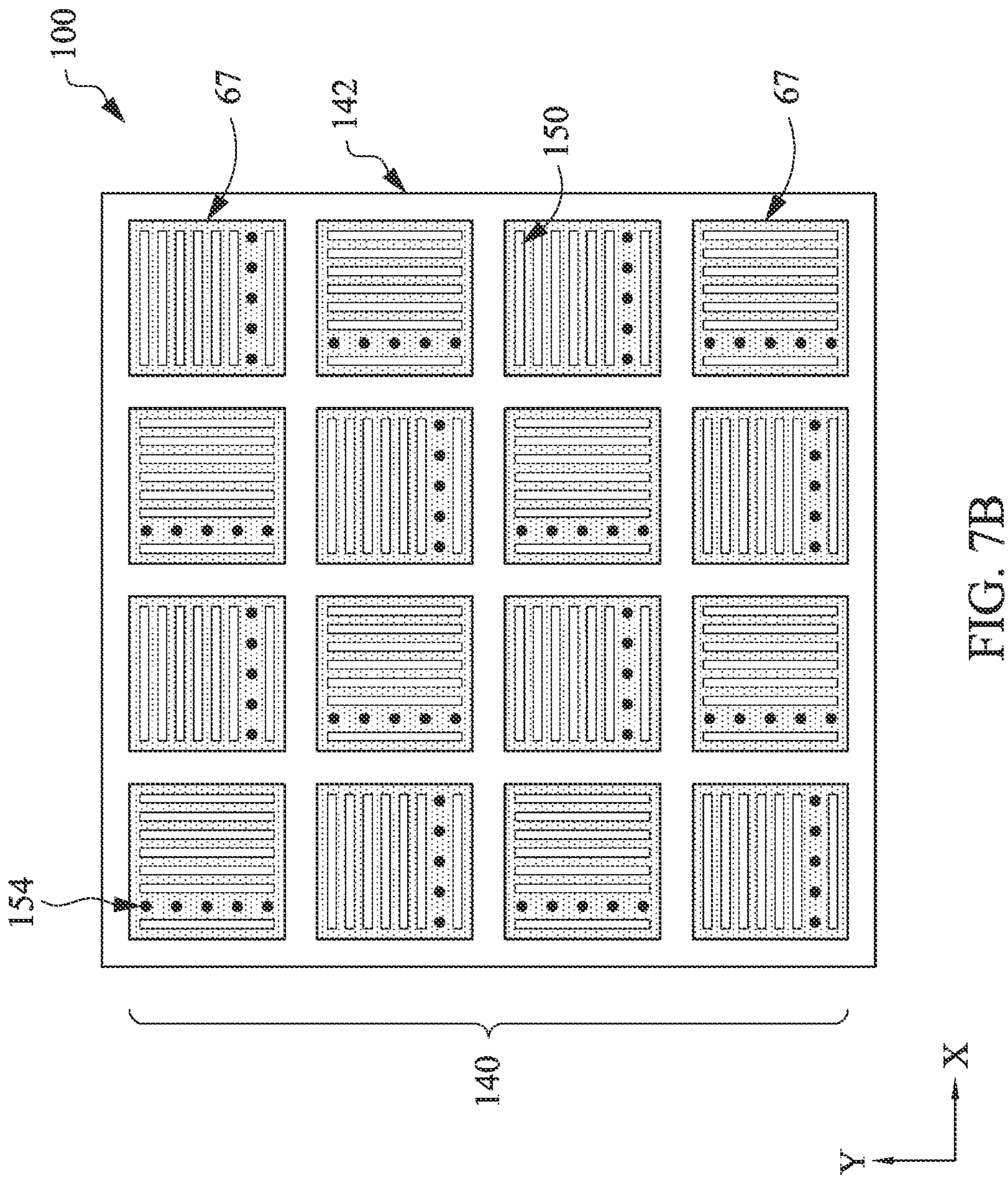
Figure 7C:
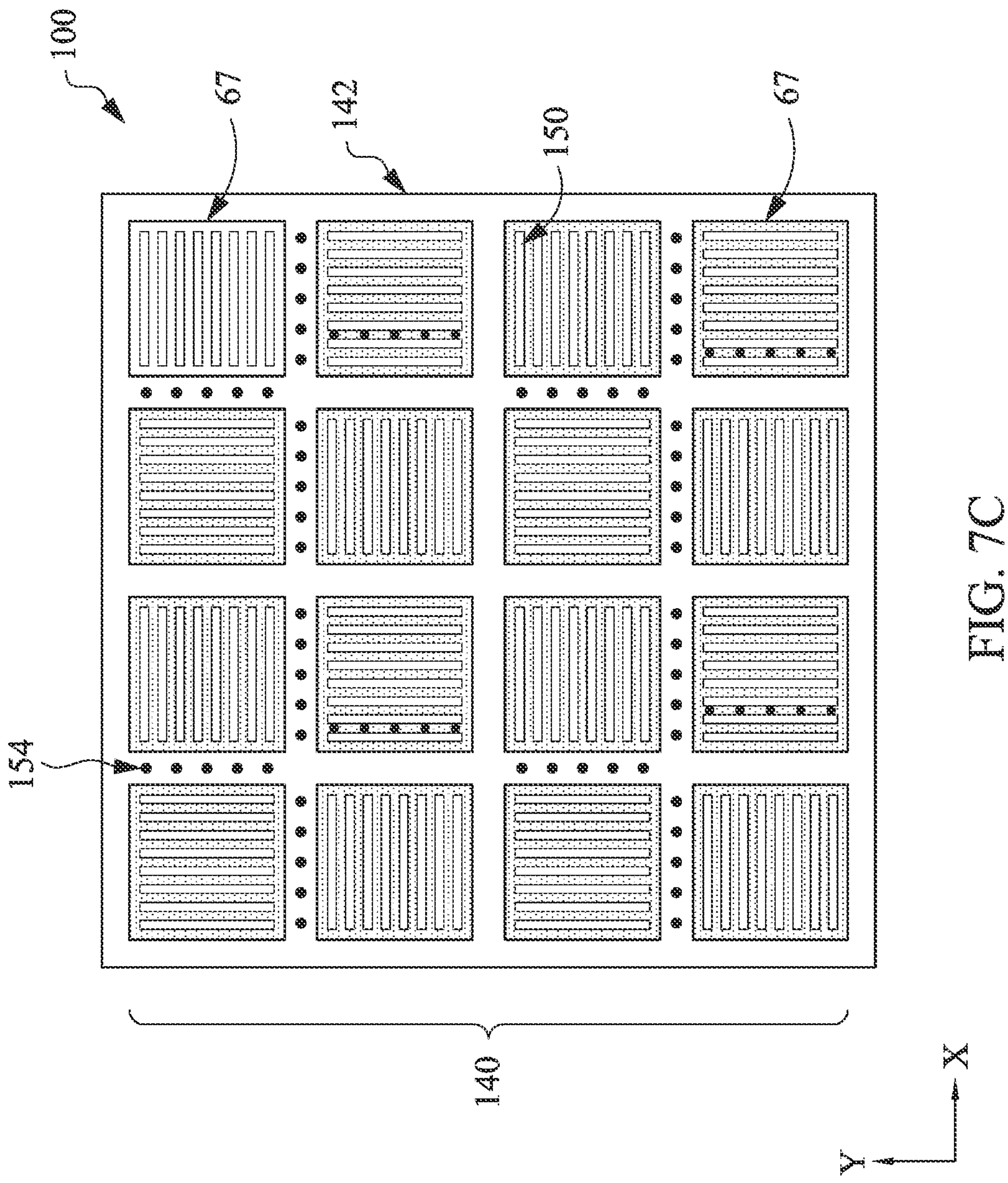
Figure 7D:
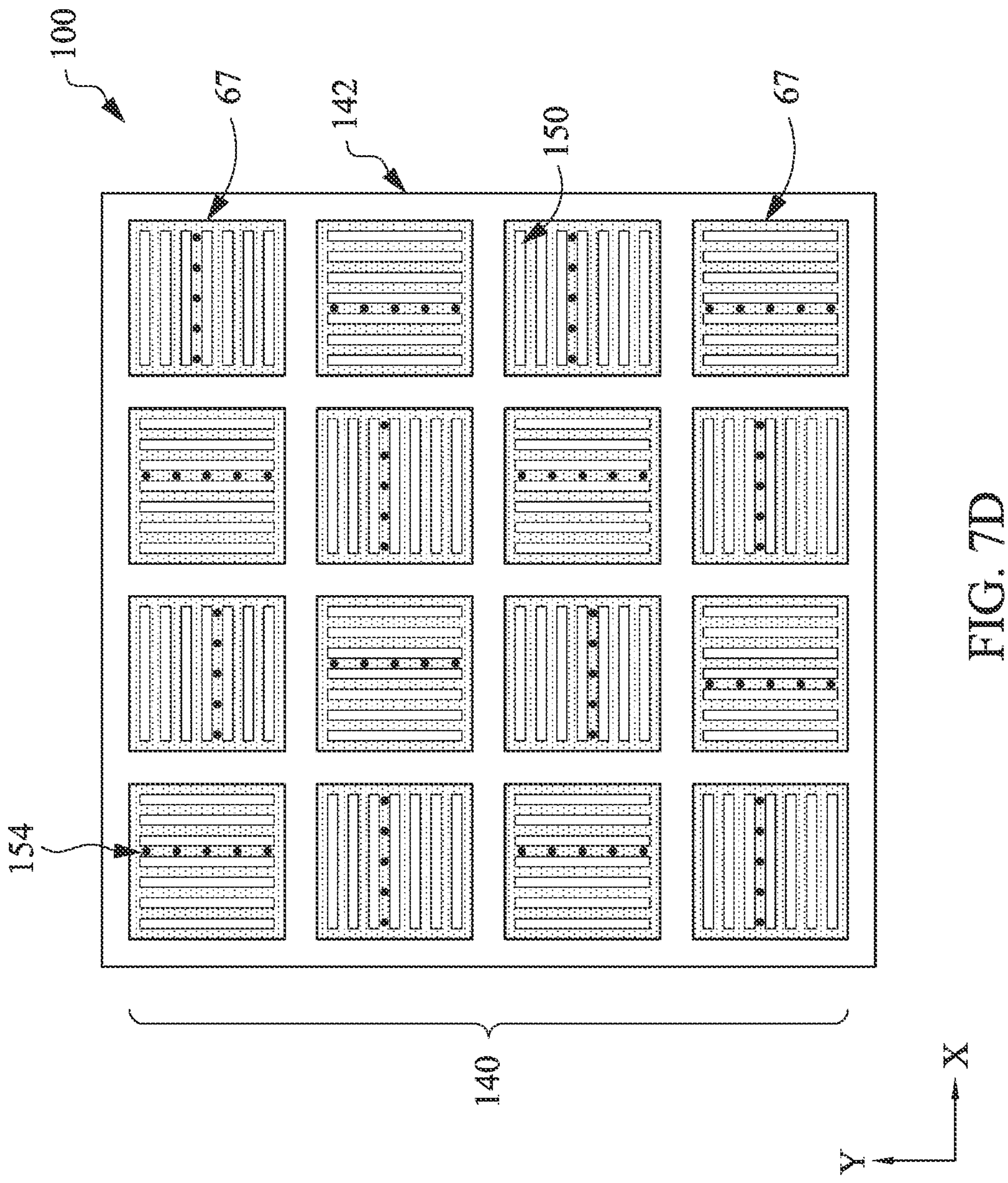
Figure 7E:
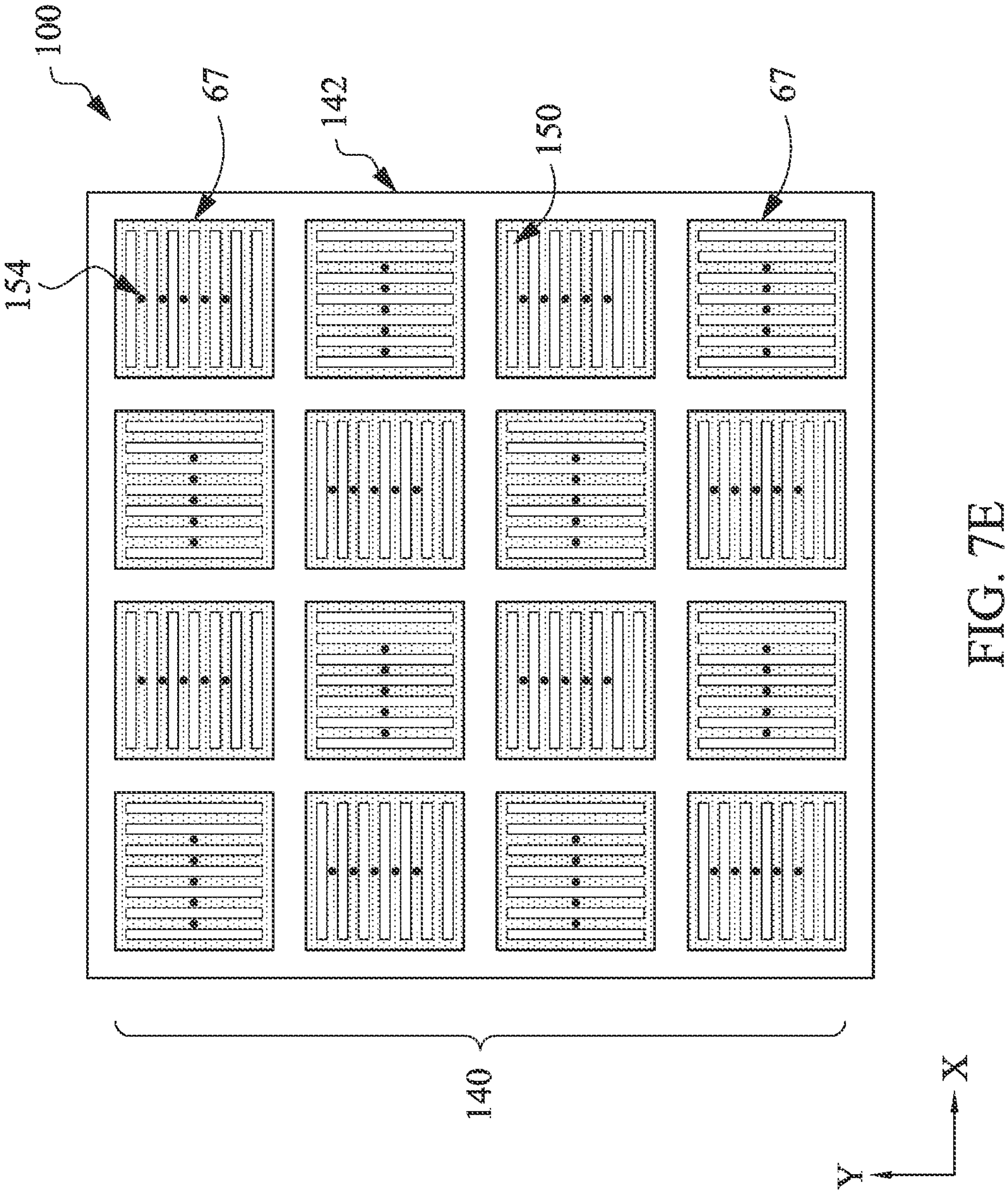

FIGS. 7A-7E are fragmentary top views of the IC structure 100, in portion or entirety, constructed in accordance with some embodiments of the present disclosure. Especially, the array 140 of DTC unit cells 67 are illustrated. As shown in FIG. 7A, the deep trenches 150 of the DTC unit cells 67 are configured in a way such that the deep trenches 150 in the adjacent DTC unit cells 67 are oriented along different directions so to reduce the stress. For example, the deep trenches 150 in one DTC unit cell 67 are longitudinally oriented along X direction and the deep trenches 150 in an adjacent DTC unit cells 67 are longitudinally oriented along Y direction. The conductive plugs 154 are placed in various configurations, as described in FIGS. 6A-6D. In FIG. 7A, the conductive plugs 154 for each DTC unit cell 67 are formed on the extended stack on one side. In FIG. 7B, the conductive plugs 154 for each DTC unit cell 67 are formed on the extended stack between adjacent deep trenches 150. In FIG. 7C, the conductive plugs 154 for each DTC unit cell 67 are either formed on the extended stack on one side or are formed on the extended stack between adjacent deep trenches 150. In FIG. 7D, the conductive plugs 154 for each DTC unit cell 67 are formed on the extended stack between adjacent deep trenches 150 but at different locations. In FIG. 7E, the conductive plugs 154 for each DTC unit cell 67 are distributed on the extended stack among adjacent deep trenches 150. In the disclosed embodiment, the diameter of the conductive plugs 154 can be controlled less than 100 angstrom, such as about 30 angstrom. Accordingly, the gap G between adjacent DTC unit cells 67 is controlled to a small amount, such as 100 A.

The formation of the DTC structure 64 is further described with reference to FIGS. 8A through 8I and 9A through 9I. FIGS. 8A through 8I are fragmentary sectional views of a DTC structure 64 at various fabrication stages, in portion or entirety, constructed in accordance with some embodiments of the present disclosure. FIGS. 9A through 9I are fragmentary sectional views of a DTC structure 64 at various fabrication stages, in portion or entirety, constructed in accordance with some embodiments of the present disclosure.

Figure 8A:
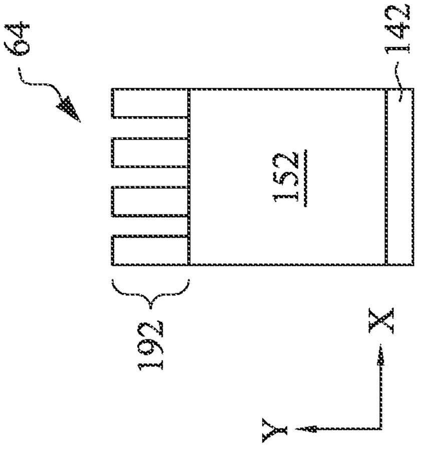
FIGS. 8A, 8B, 8C, 8D, 8E, 8F, 8G, 8H and 8I are sectional views of a deep trench capacitor at various fabrication stages, constructed at various fabrication stages according to various embodiments of the present disclosure.

Referring to FIG. 8A, the dielectric material layer 152 over the substrate 142 is patterned to form deep trenches. In some embodiments, the substrate 142 is directly patterned to form deep trenches therein. The operation includes forming a patterned etch mask 192 by a lithography process. In some embodiments, the etch mask 192 is a soft etch mask, such as a patterned photoresist layer. A patterned photoresist layer is formed by a lithography process. In alternative embodiments, the etch mask 192 is a hard etch mask, such as silicon oxide or other suitable dielectric material layer. In furtherance of the embodiments, a patterned photoresist layer is formed by a lithography process. An etching process is applied to the hard mask to transfer the openings of the patterned photoresist layer to the hard mask. The openings of the etch mask 192 define the regions for deep trenches. The patterned photoresist layer may be removed by wet stripping or plasma ashing after the formation of the hard mask.

Figure 8B:
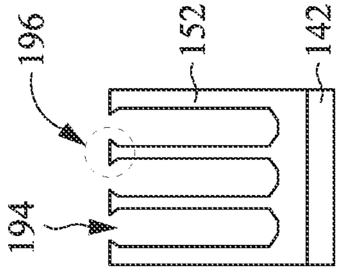

Referring to FIG. 8B, the dielectric material layer 152 is patterned to form deep trenches 194 by a suitable etching process, such as wet etch, dry etch or a combination thereof. In the disclosed embodiment, the etching process includes a dry etching process using an etchant containing fluorine, chlorine or a combination thereof, such as silicon tetrafluoride ($SiF_4$), silicon fluorine radical $SiF_x$ (x is 1, 2 or 3), silicon tetrachloride ($SiCl_4$), silicon chloride radical $SiCl_x$ (x is 1, 2 or 3), or a combination thereof. The etching process is implemented at a temperature ranging between 100° C. and 300° C. according to some embodiments. It is noted that the walls of the deep trenches 194 have a narrow opening and the patterned dielectric material layer 152 has hangover portions on the top of the walls of the deep trenches 194, such as indicated in the dashed circle 196.

Figure 8C:
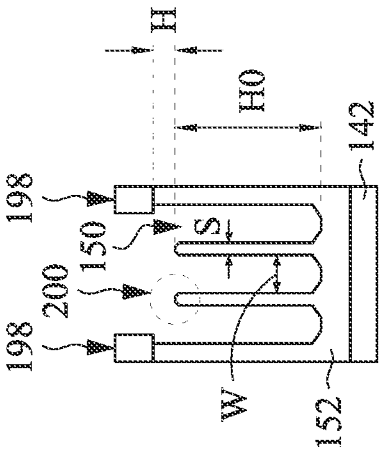

Referring to FIG. 8C, a second etching process is applied to the dielectric material layer 152, thereby modifying the profiles of the deep trenches 194 and forming deep trenches 150. In this operation, a second etch mask 198 is formed on the dielectric material layer 152, such as a hard mask by a lithography process and an etching process or a soft mask by a lithography process. The etch mask 198 also includes one or more opening but is different from the openings of the etch mask 192. In the disclosed embodiment, the etch mask 198 includes an opening to expose the walls of the deep trenches in the DTC structure 64 except for the edge walls of the DTC structure 64. In this case, the second etching process is applied to the exposed walls of the deep trenches in the DTC structure 64 so to etch and remove the hangover portions of the exposed walls of the deep trenches, thereby modifying the wall tops into round and narrow tips, as indicated by the dashed circle 200. The second etching process is similar to the first etching process in FIG. 8B in terms of etchant and etching temperature. In furtherance of the present embodiment, the walls of the deep trenches 150 have uneven heights with a height difference H. In some embodiments, H ranges between 100 angstrom and 1000 angstrom, and $H_0$ ranges between 0.5 μm and 50 μm.

Figure 8D:
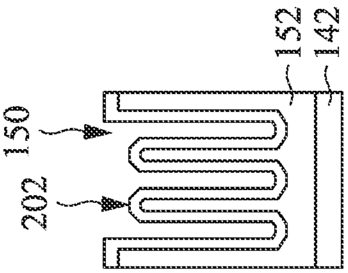

Referring to FIG. 8D, a dielectric liner 202 may be further formed in the deep trenches 150 by a suitable method, such as a thermal process, CVD, other suitable method or a combination thereof. In some embodiments, the dielectric liner 202 is an oxide layer, such as undoped silica glass. The formation of the dielectric liner 202 includes performing a thermal annealing process in a furnace with oxygen environment at an elevated annealing temperature. In some embodiments, the deep trenches 150 are formed in the substrate 142 including silicon, the formation of the dielectric liner 202 includes performing a thermal oxidation process in a furnace in an environment containing oxygen. In some embodiments, the annealing temperature ranges between 800° C. and 1200° C. In some embodiments, the dielectric liner 202 has a thickness ranging between 10 angstrom and 500 angstrom. In some embodiments, the deep trenches 150 are formed in the dielectric layer 152 including a dielectric material, the formation of the dielectric liner 202 includes performing an annealing process in a furnace in an environment containing oxygen and silane. In some embodiments, the annealing temperature ranges between 800° C. and 1200° C. In some embodiments, the dielectric liner 202 has a thickness ranging between 10 angstrom and 500 angstrom.

Figure 8G:
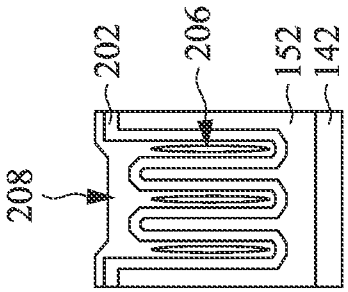
Figure 8E:
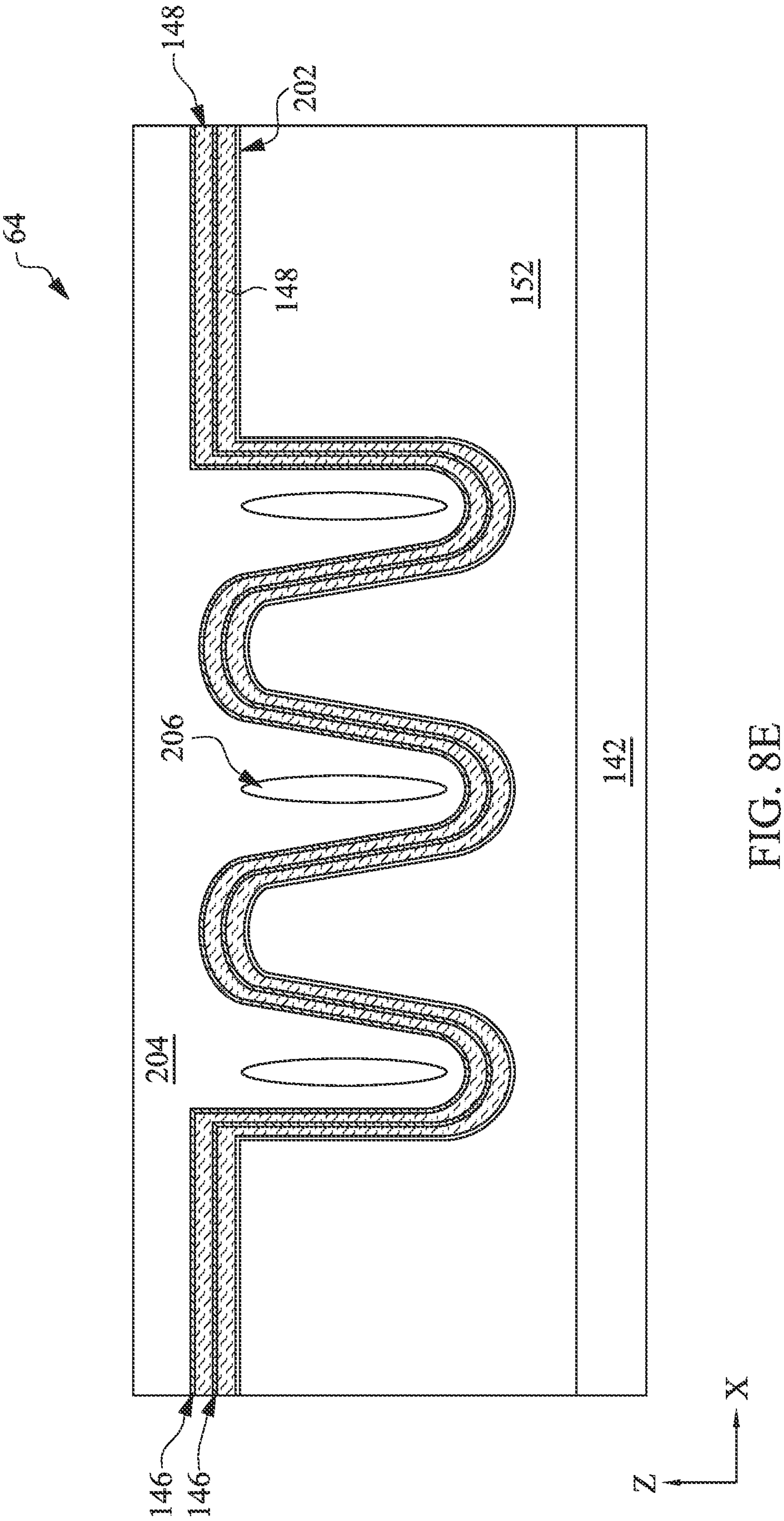

Referring to FIG. 8E, the stacks of the conductive layers 146 and the dielectric layers 148 are sequentially deposited on the dielectric material layer 152 in the deep trenches 150 as described above. Particularly, the dielectric layers 148 may include any suitable dielectric materials, such as silicon oxide, silicon nitride, silicon oxynitride, other suitable dielectric material or a combination thereof. The dielectric layers 148 may be formed by CVD, atomic layer deposition (ALD), other suitable deposition method or a combination thereof. The conductive layer may include metal, such as copper, aluminum or tungsten, or metal alloy, such as aluminum copper alloy, other metal alloy, other suitable conductive material or a combination thereof. The conductive layers 146 may be formed by PVD, plating, CVD, other suitable method or a combination thereof.

Still referring to FIG. 8E, a dielectric film of a compressive stress 204 is formed over the stack in the deep trenches 150 so to form voids (air gaps) 206 in the deep trenches 150 and seal the voids in the deep trenches. This can be achieved by various factors such as by controlling the deposition rate to be greater enough so that the dielectric film 204 deposits in the deep trenches 150 and quickly closes up on the top, leaving voids 206 in the deep trenches 150. In the disclosed embodiment, the deposition of the dielectric film 204 is implemented at an elevated temperature so the dielectric film 204 is constrained with compressive stress when the workpiece cools down to the room temperature. Such deposited dielectric film 204 and the DTC structure 64 can effectively reduce the substrate warpage issues for two reasons. Since the stack of the conductive layers 146 and the dielectric layers 148 have tensile stress to the workpiece, the compressive stress of the dielectric film 204 compensate the tensile stress of the stack, and the voids 206 formed in the DTC structure 64 provides free spaces to the workpiece to further release any stress if present.

The dielectric film 204 may be formed by CVD, a furnace process, other suitable method or a combination thereof. In some embodiments, the dielectric film 204 is formed by CVD. In furtherance of the embodiments, the dielectric film 204 includes nitrogen-free anti-reflection layer (NFARL), $SiO_2$, undoped silica glass (USG), silicon carbide, other suitable dielectric material or a combination thereof. For example, the dielectric film 204 includes silicon oxide formed by CVD using a precursor including tetraethoxysilane $Si(OC_2H_5)_4$ (TEOS). The deposition temperature ranges between 800° C. and 1200° C. according to some embodiments.

In some embodiments, the dielectric film 204 is formed by a furnace process with a processing temperature ranging between 800° C. and 1200° C. In furtherance of the embodiments, the dielectric film 204 includes silicon nitride, $SiO_2$, undoped silica glass (USG), silicon carbide, polysilicon, other suitable material or a combination thereof. For example, the dielectric film 204 includes silicon oxide formed in a furnace using a precursor including TEOS.

Figure 8F:
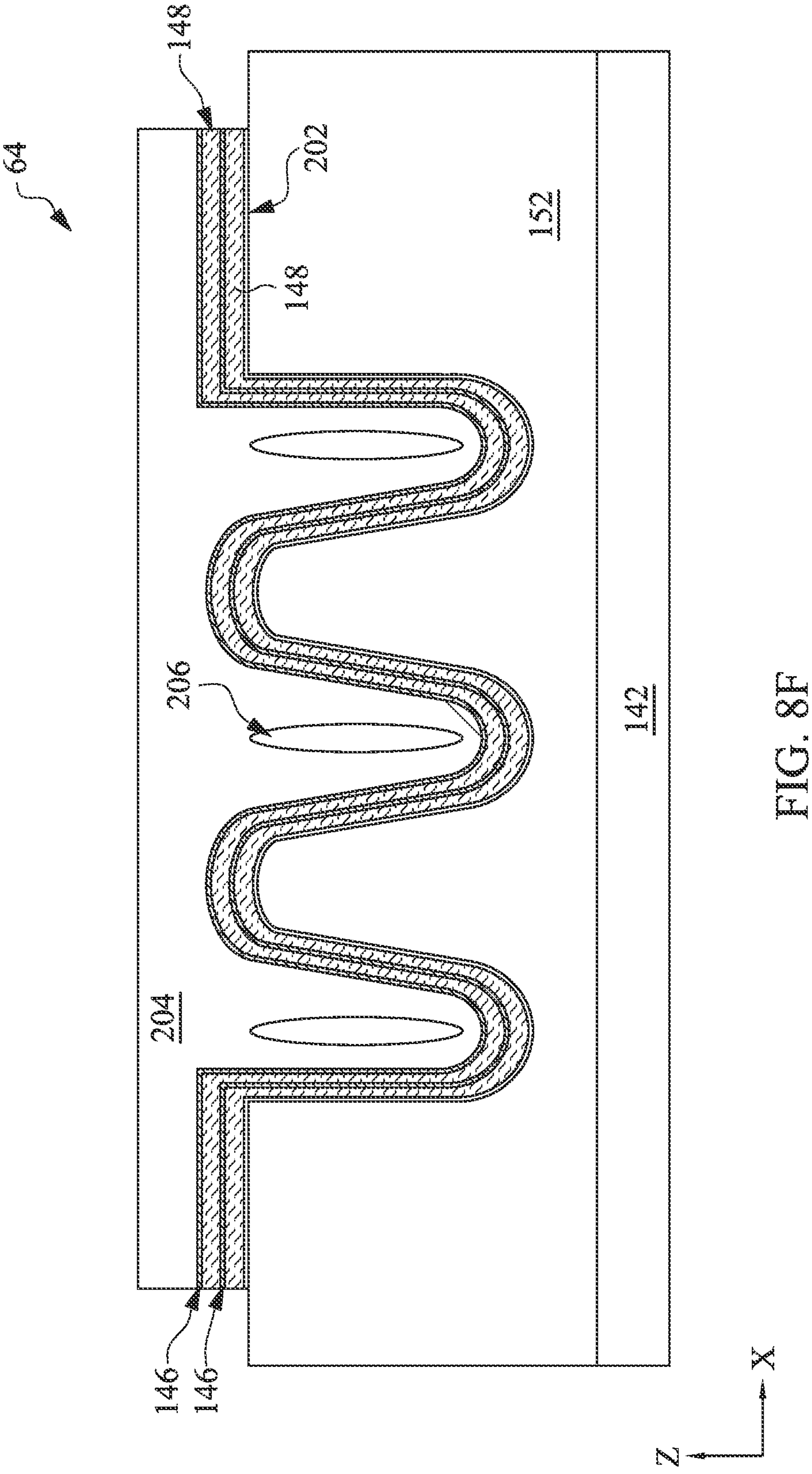
Figure 8I:
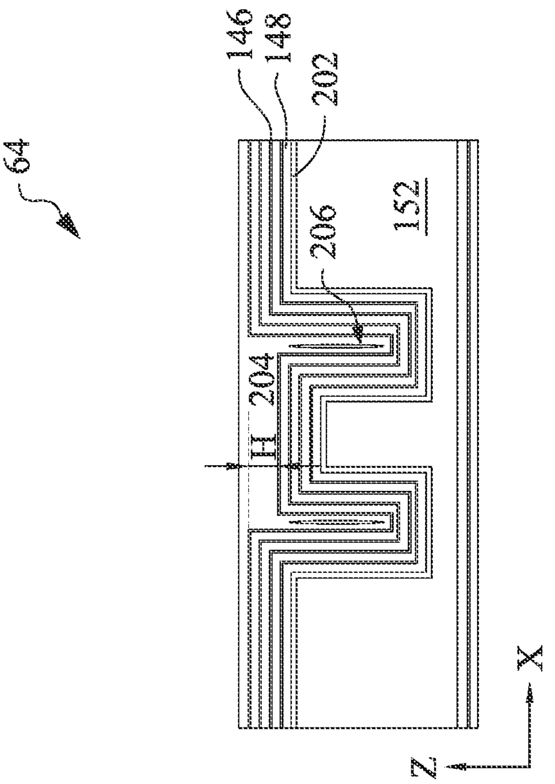
Figure 8H:
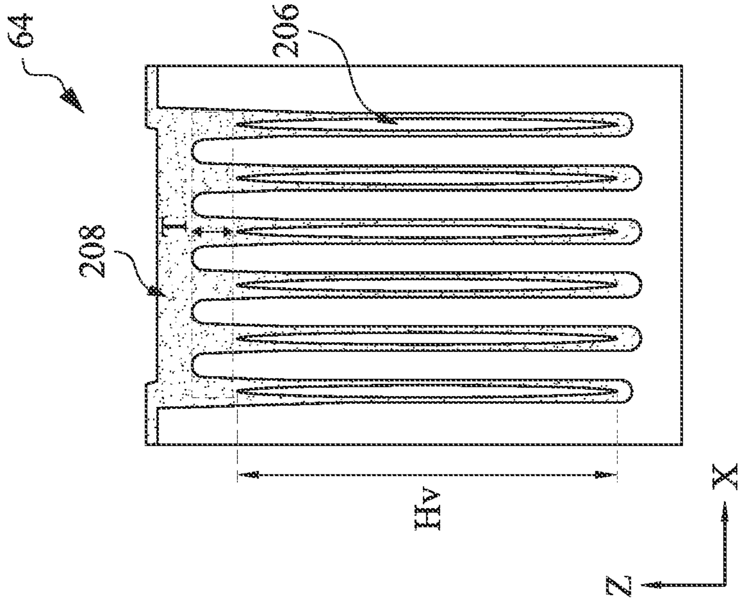

Referring to FIG. 8F, the stack is further patterned such that the stack of the conductive layers 146 and the dielectric layers 148 for one DTC structure 64 defined, such as being separated from that of an adjacent DTC structure 64. The DTC structure 64 is further illustrated in FIGS. 8H and 8I. In some embodiments, H ranges between 100 angstrom and 1000 angstrom, and $H_0$ ranges between 0.5 μm and 50 μm. The voids 206 vertically extend about the vertical dimension Hv of the deep trenches 150. For example, the voids 206 vertically span a dimension Hv ranging between 0.5 μm and 50 μm. the dielectric film 204 or collectively 208 above the voids 206 vertically span a dimension T greater than 50 angstrom, such as ranging between 50 angstrom and 200 angstrom from the voids 206 to the top surface of the deep trenches 150. In some embodiments, the ratio $H/H_0$ ranges between 0.02 and 0.002. In some embodiments, the aspect ratio (width/depth) of the deep trenches 150 ranges between 1 and 1000, or between 10 and 100. The width W of the deep trenches 150 and the wall thickness S (or the spacing between adjacent deep trenches) defines a ratio W/S greater than 2, such as ranging between 2 and 20. FIG. 8I further illustrates the uneven heights of the deep trenches 150.

The final DTC structure 64 is further illustrated in FIG. 8G, in which the 208 collectively represents the stack of the dielectric layers 148 and the conductive layers 146, and the dielectric film 204. Especially, the voids 206 are formed in the deep trenches 150 and dielectric film of a compressive stress seals voids 206 in the deep trenches 150. Furthermore, the walls of the deep trenches 150 in the DTC structure 64 have different heights. Other features of the DTC structure 64, such as conductive plugs, will be further described later.

Figure 9A:
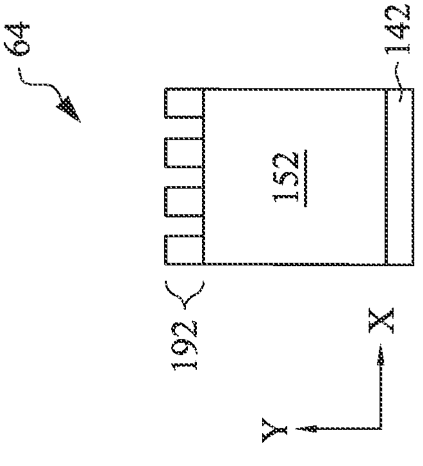
FIGS. 9A, 9B, 9C, 9D, 9E, 9F, 9G, 9H and 9I are sectional views of a deep trench capacitor at various fabrication stages, constructed at various fabrication stages according to various embodiments of the present disclosure.

Referring to FIG. 9A, the dielectric material layer 152 over the substrate 142 is patterned to form deep trenches. The operation includes forming a patterned etch mask 192 by a lithography process. In some embodiments, the etch mask 192 is a soft etch mask, such as a patterned photoresist layer. A patterned photoresist layer is formed by a lithography process. In alternative embodiments, the etch mask 192 is a hard etch mask, such as silicon oxide or other suitable dielectric material layer. In furtherance of the embodiments, a patterned photoresist layer is formed by a lithography process. An etching process is applied to the hard mask to transfer the openings of the patterned photoresist layer to the hard mask. The openings of the etch mask 192 define the regions for deep trenches. The patterned photoresist layer may be removed by wet stripping or plasma ashing after the formation of the hard mask.

Figure 9B:
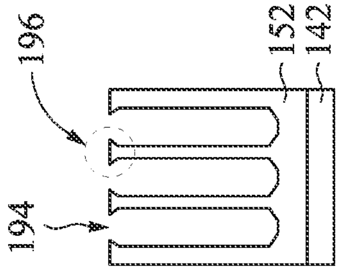

Referring to FIG. 9B, the dielectric material layer 152 is patterned to form deep trenches 194 by a suitable etching process, such as wet etch, dry etch or a combination thereof. In the disclosed embodiment, the etching process includes a dry etching process using an etchant containing fluorine, chlorine or a combination thereof, such as silicon tetrafluoride ($SiF_4$), silicon fluorine radical $SiF_x$ (x is 1, 2 or 3), silicon tetrachloride ($SiCl_4$), silicon chloride radical $SiCl_x$ (x is 1, 2 or 3), or a combination thereof. The etching process is implemented at a temperature ranging between 100° C. and 300° C. according to some embodiments. It is noted that the walls of the deep trenches 194 have a narrow opening and the patterned dielectric material layer 152 has hangover portions on the top of the walls of the deep trenches 194, such as indicated in the dashed circle 196.

Figure 9C:
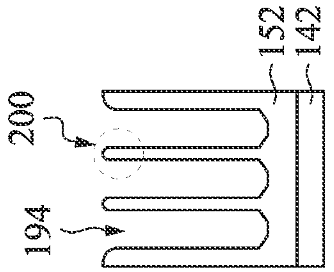

Referring to FIG. 9C, a second etching process is applied to the dielectric material layer 152 without etch mask, thereby modifying the profiles of the deep trenches 194 and forming deep trenches 150. In this operation, no etch mask is used. Only a second etching process is applied to the exposed walls of the deep trenches in the DTC structure 64 so to etch and remove the hangover portions of all walls of the deep trenches, thereby modifying the wall tops into round and narrow tips, as indicated by the dashed circle 200. The second etching process is similar to the first etching process in FIG. 8B in terms of etchant and etching temperature. In furtherance of the present embodiment, the walls of the deep trenches 150 have an even height since all walls are similarly modified by the second etching process. In some embodiments, the aspect ratio (width/depth) of the deep trenches 150 ranges between 1 and 1000, or between 10 and 100. The width W of the deep trenches 150 and the wall thickness S (or the spacing between adjacent deep trenches) defines a ratio W/S greater than 2, such as ranging between 2 and 20.

Figure 9D:
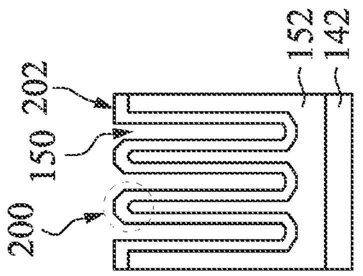

Referring to FIG. 9D, another dielectric liner 202 may be further deposited in the deep trenches 150 by a suitable method, such as a thermal process, CVD, other suitable method or a combination thereof. In some embodiments, the dielectric liner 202 is an oxide layer, such as undoped silica glass. The formation of the dielectric liner 202 includes performing an annealing process in a furnace with oxygen environment at an elevated annealing temperature. In some embodiments, the formation of the dielectric liner 202 includes performing an annealing process in a furnace in an environment containing oxygen and silane. In some embodiments, the annealing temperature ranges between 800° C. and 1200° C. In some embodiments, the dielectric liner 202 has a thickness ranging between 100 angstrom and 300 angstrom.

Figure 9G:
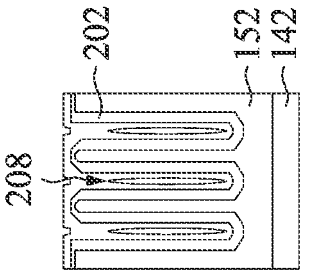
Figure 9E:
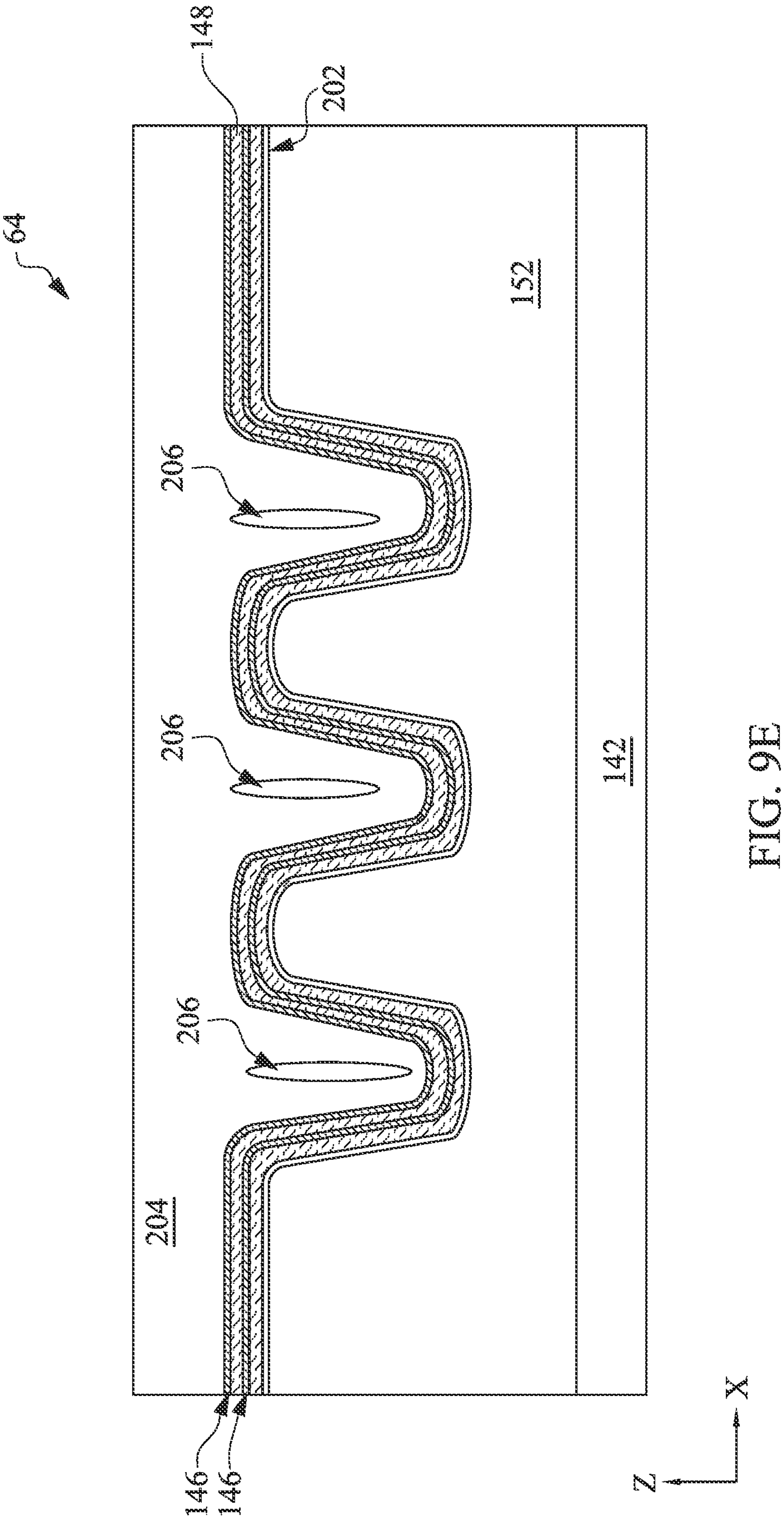

Referring to FIG. 9E, the stacks of the conductive layers 146 and the dielectric layers 148 are sequentially deposited on the dielectric material layer 152 in the deep trenches 150 as described above. Particularly, the dielectric layers 148 may include any suitable dielectric materials, such as silicon oxide, silicon nitride, silicon oxynitride, other suitable dielectric material or a combination thereof. The dielectric layers 148 may be formed by CVD, ALD, other suitable deposition method or a combination thereof. The conductive layer may include metal, such as copper, aluminum or tungsten, or metal alloy, such as aluminum copper alloy, other metal alloy, other suitable conductive material or a combination thereof. The conductive layers 146 may be formed by PVD, plating, CVD, other suitable method or a combination thereof.

Still referring to FIG. 9E, a dielectric film of a compressive stress 204 is formed over the stack in the deep trenches 150 so to form voids (air gaps) 206 in the deep trenches 150 and seal the voids 206 in the deep trenches. This can be achieved by various factors such as by controlling the deposition rate to be greater enough so that the dielectric film 204 deposits in the deep trenches 150 and quickly closes up on the top, leaving voids 206 in the deep trenches 150. In the disclosed embodiment, the deposition of the dielectric film 204 is implemented at an elevated temperature so the dielectric film 204 is constrained with compressive stress when the workpiece cools down to the room temperature. Such deposited dielectric film 204 and the DTC structure 64 can effectively reduce the substrate warpage issues for two reasons. Since the stack of the conductive layers 146 and the dielectric layers 148 have tensile stress to the workpiece, the compressive stress of the dielectric film 204 compensate the tensile stress of the stack, and the voids 206 formed in the DTC structure 64 provides free spaces to the workpiece to further release any stress if present.

The dielectric film 204 may be formed by CVD, a furnace process, other suitable method or a combination thereof. In some embodiments, the dielectric film 204 is formed by CVD. In furtherance of the embodiments, the dielectric film 204 includes NFARL, $SiO_2$, USG, silicon carbide, other suitable dielectric material or a combination thereof. For example, the dielectric film 204 includes silicon oxide formed by CVD using a precursor including TEOS. The deposition temperature ranges between 800° C. and 1200° C. according to some embodiments.

In some embodiments, the dielectric film 204 is formed by a furnace process with a processing temperature ranging between 800° C. and 1200° C. In furtherance of the embodiments, the dielectric film 204 includes silicon nitride, $SiO_2$, USG, silicon carbide, polysilicon, other suitable material or a combination thereof. For example, the dielectric film 204 includes silicon oxide formed in a furnace using a precursor including TEOS.

Figure 9F:
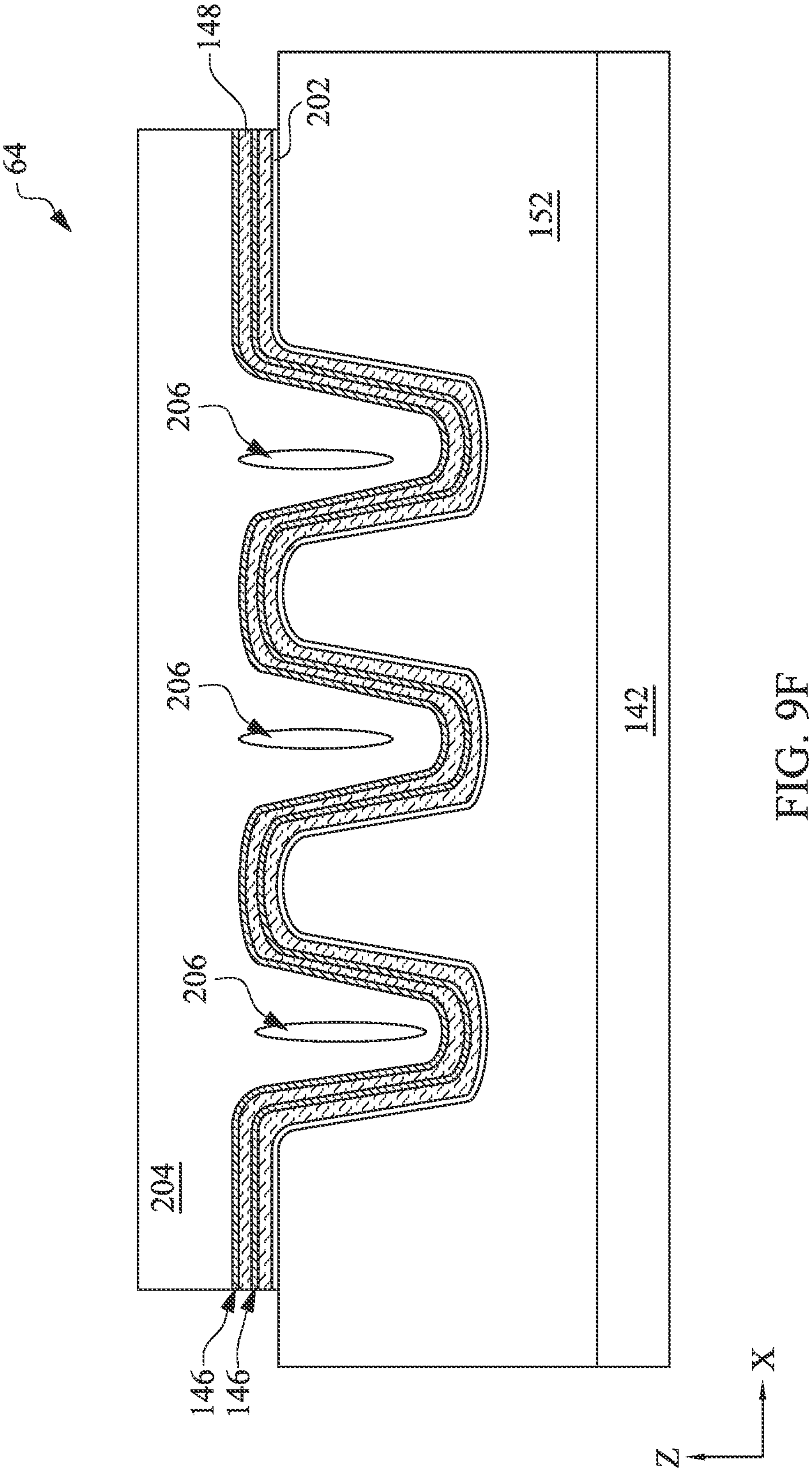

Referring to FIG. 9F, the stack is further patterned such that the stack of the conductive layers 146 and the dielectric layers 148 for one DTC structure 64 defined, such as being separated from that of an adjacent DTC structure 64. Another dielectric layer may be further deposited on the patterned stack and the dielectric layer 158.

The final DTC structure 64 is further illustrated in FIG. 9G, in which the 208 collectively represents the stack of the dielectric layers 148 and the conductive layers 146, and the dielectric film 204. Especially, the voids 206 are formed in the deep trenches 150 and dielectric film of a compressive stress seals voids 206 in the deep trenches 150. Furthermore, the walls of the deep trenches 150 in the DTC structure 64 have the same height.

Figure 9I:
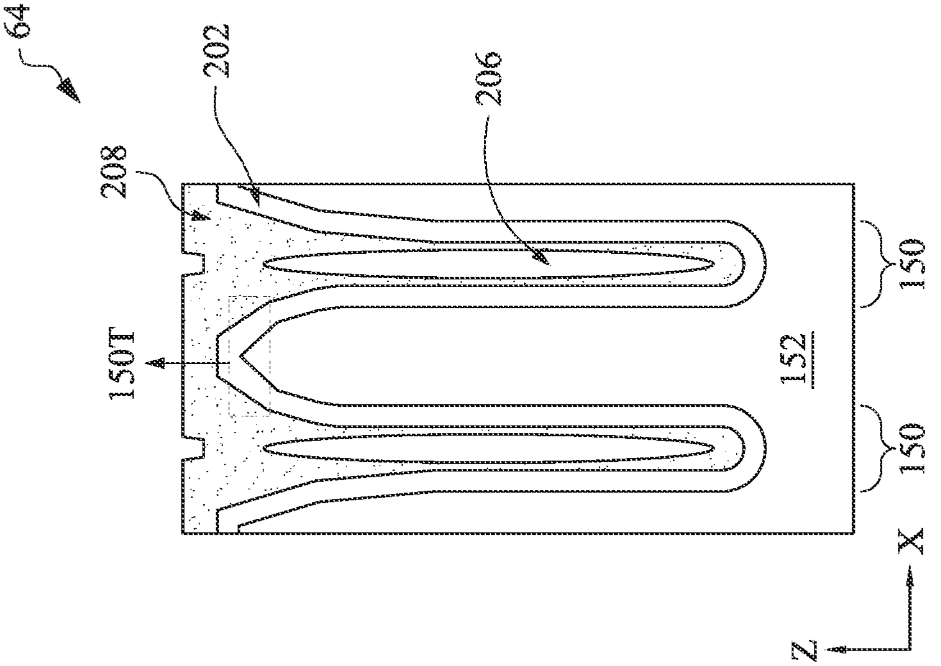
Figure 9H:
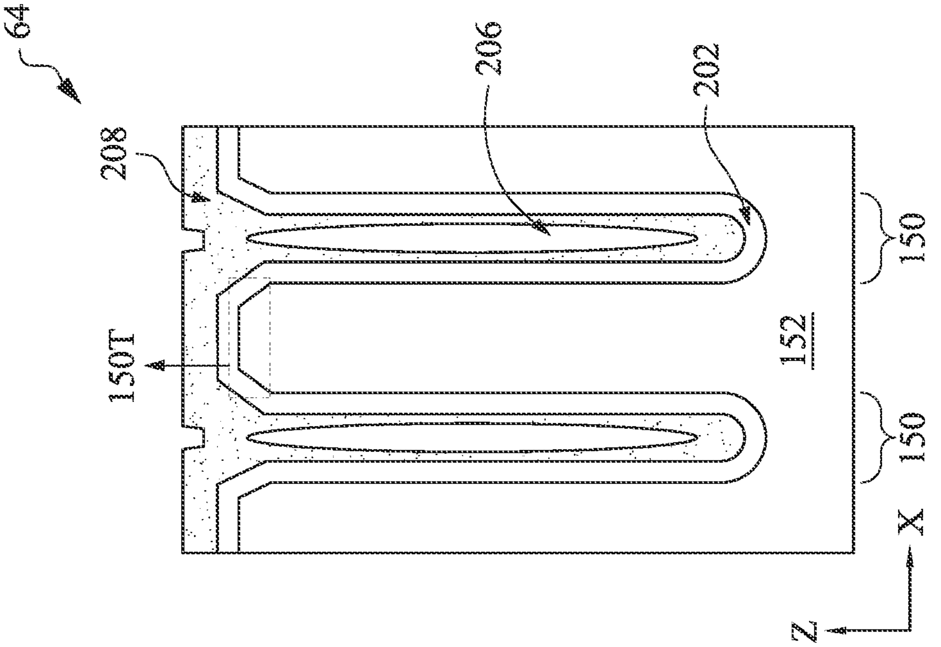

The DTC structure 64 is also illustrated in FIGS. 9H and 9I. The tip portions 150T of the walls of the deep trenches 150 may include different shapes, depending on the tuning and controlling of the etching processes applied to the dielectric material layer 152. In some embodiments, the tip portions 150T of the walls of the deep trenches 150 have a trapezoid shape such as illustrated in FIG. 9H. In some embodiments, the tip portions 150T of the walls of the deep trenches 150 have a sharp tip trapezoid shape such as illustrated in FIG. 9I.

Other features of the DTC structure 64, such as conductive plugs, will be further described below with reference to FIGS. 10A-10D and other figures. FIGS. 10A through 10D are fragmentary sectional views of a DTC structure 64 at various fabrication stages, in portion or entirety, constructed in accordance with some embodiments of the present disclosure.

Figure 10A:
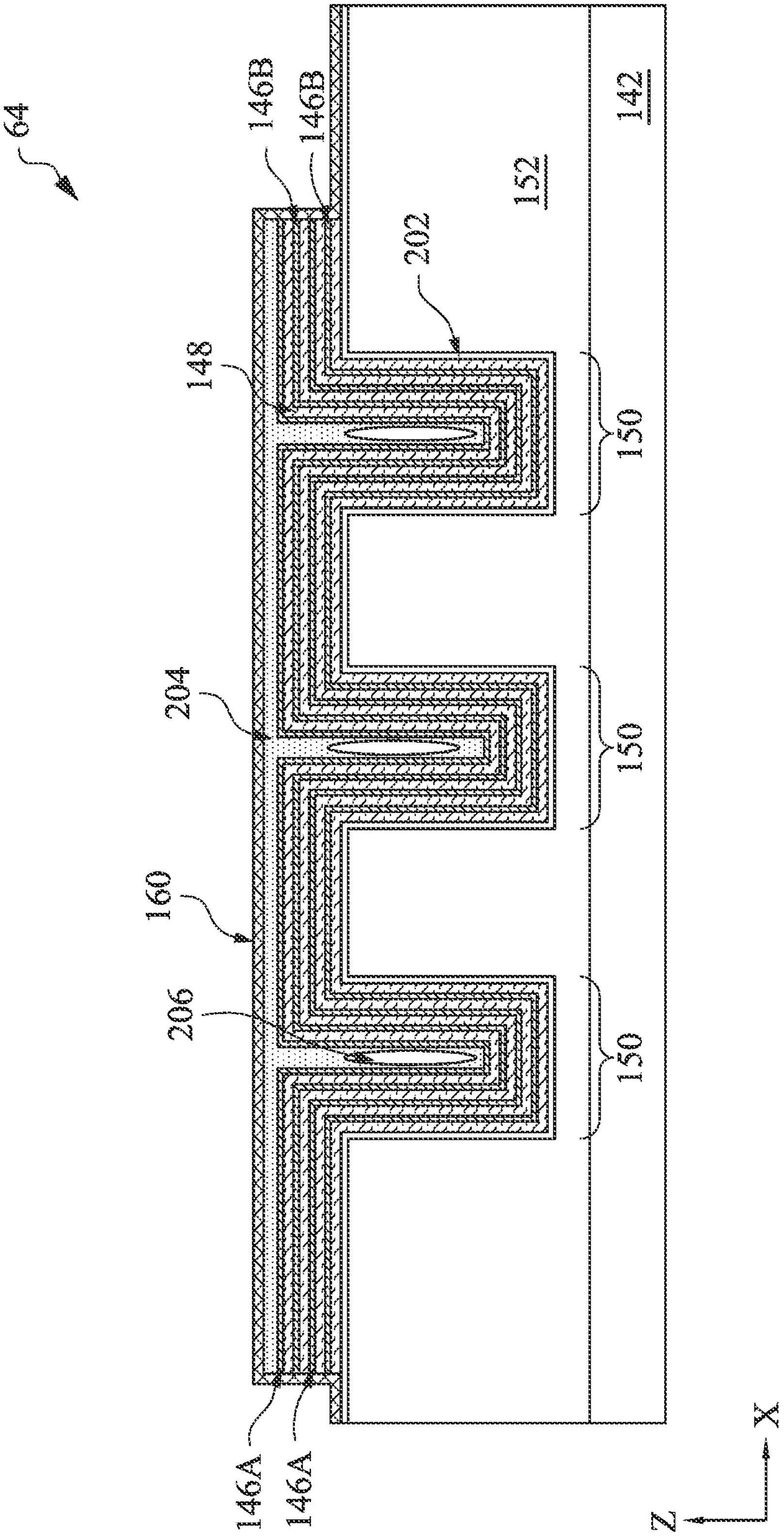
FIGS. 10A, 10B, 10C and 10D are sectional views of a deep trench capacitor structure at various fabrication stages constructed according to various embodiments of the present disclosure.

Referring to FIG. 10A, the DTC structure 64 illustrated herein may be the DTC structure 64 described in FIGS. 8A-8G or FIGS. 9A-9G according to various embodiments. However, it is simplified here to illustrate the formation of the conductive plugs of the DTC structure 64 and it is not intended to limit. The stack of the conductive layer 146 and the dielectric layers 148 are formed in the deep trenches 150 and are patterned. In some embodiments, another dielectric layer 160 may be further deposited on the patterned stack and the dielectric layer 204. The dielectric layer 160 may include one or more dielectric material, such as a silicon oxide layer and a silicon nitride layer on the silicon oxide layer.

Figure 10B:
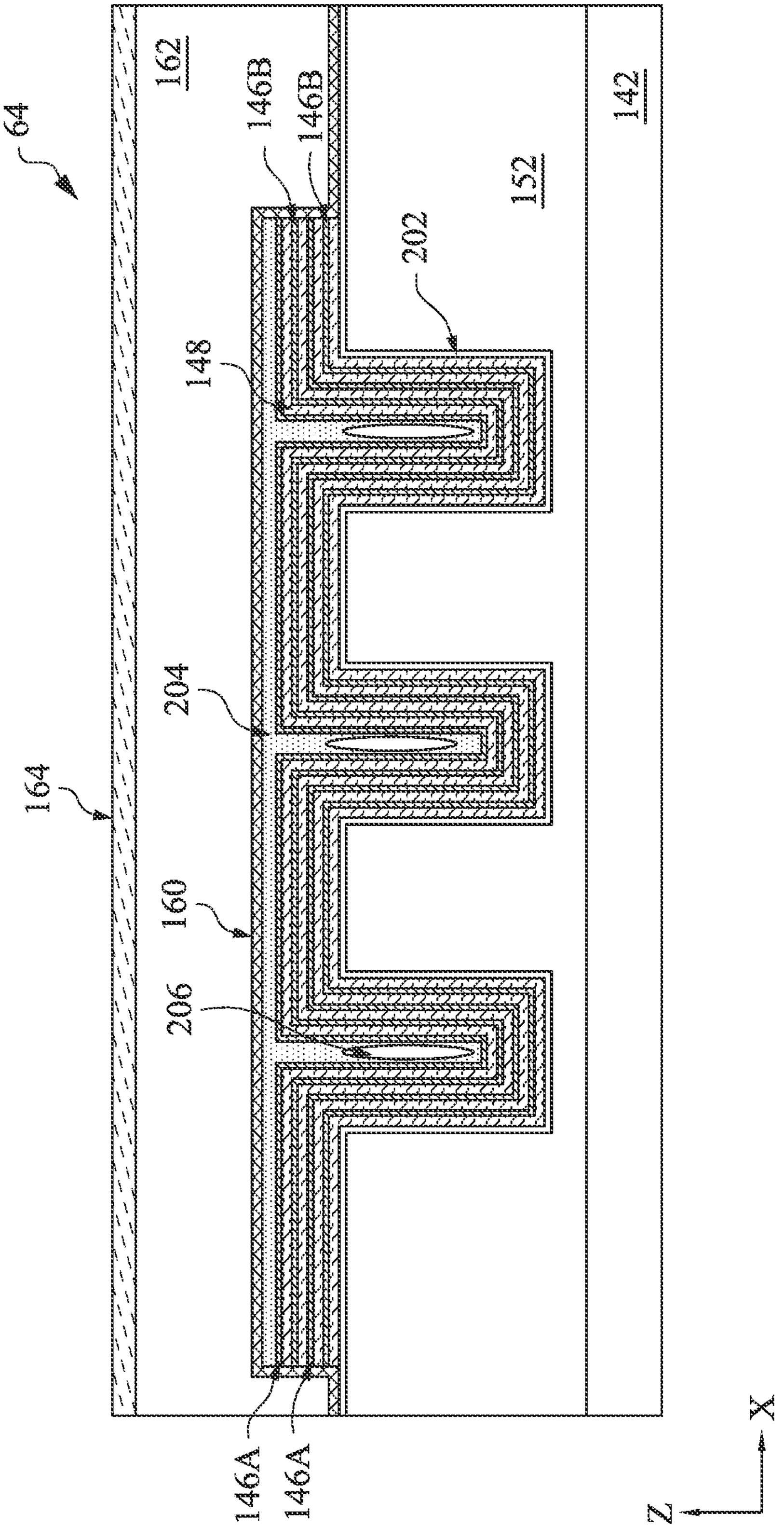

Referring to FIG. 10B, a dielectric material layer 162 is formed on the patterned stack and the dielectric film 202. The dielectric material layer 162 may include one or more dielectric material, such as USG. The thickness of the dielectric material layer 162 is designed with consideration of the conductive plugs to be formed. In the disclosed embodiment, the thickness of the dielectric material layer 162 is less than 1 micron. The dielectric material layer 162 is formed by any suitable process, such as deposition by CVD and planarization by CMP. A hard mask 164 may be further formed on the dielectric material layer 162, used as an etch mask to pattern the dielectric material layer 162. In some embodiments, the hard mask 164 includes one or more suitable material, such as silicon oxide, silicon nitride, silicon oxynitride, other suitable dielectric material or a combination thereof. In the disclosed embodiment, the hard mask 164 includes a silicon oxynitride layer and a silicon oxide layer over the silicon oxynitride layer.

Figure 10C:
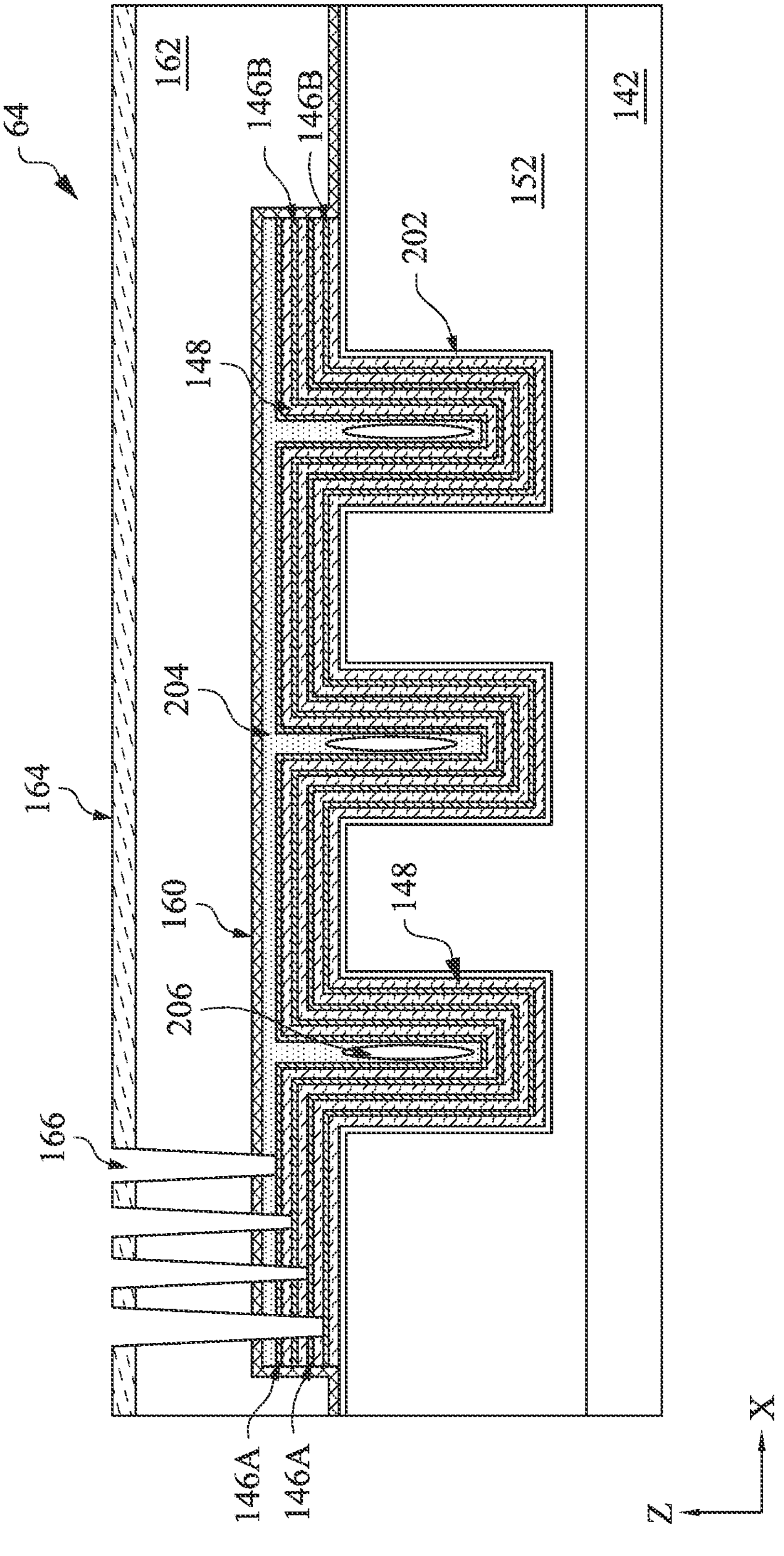

Referring to FIG. 10C, the dielectric material layer 162 is patterned to form deep via holes 166 by a lithography process and etch. The via holes 166 are designed to form the conductive plugs 154 therein. In the disclosed embodiment, the patterning process may include patterning the hard mask 164 to form openings by lithography process and etch; etching the dielectric material layer 162 using the patterned hard mask 164 as an etch mask. Particularly, since the conductive plugs 154 are landing on respective conductive layers 146 with different heights, the via holes 166 are formed with respective depths and expose respective conductive layers 146 at the bottom surfaces of the via holes 166. One method to achieve this structure, a number of the patterning processes are applied to the dielectric material layer 162 to form the via holes 166. For example, if the number of the conductive layers 146 is N1 (such as 4 in the illustrated example), the number of patterning processes is N1 (such as 4 in the illustrated example). This means N1 patterning processes each further including one lithography process and one etch process. After the patterning process, the via holes 166 are formed to expose respective conductive layers 146 as illustrated in FIG. 10C.

Figure 10D:
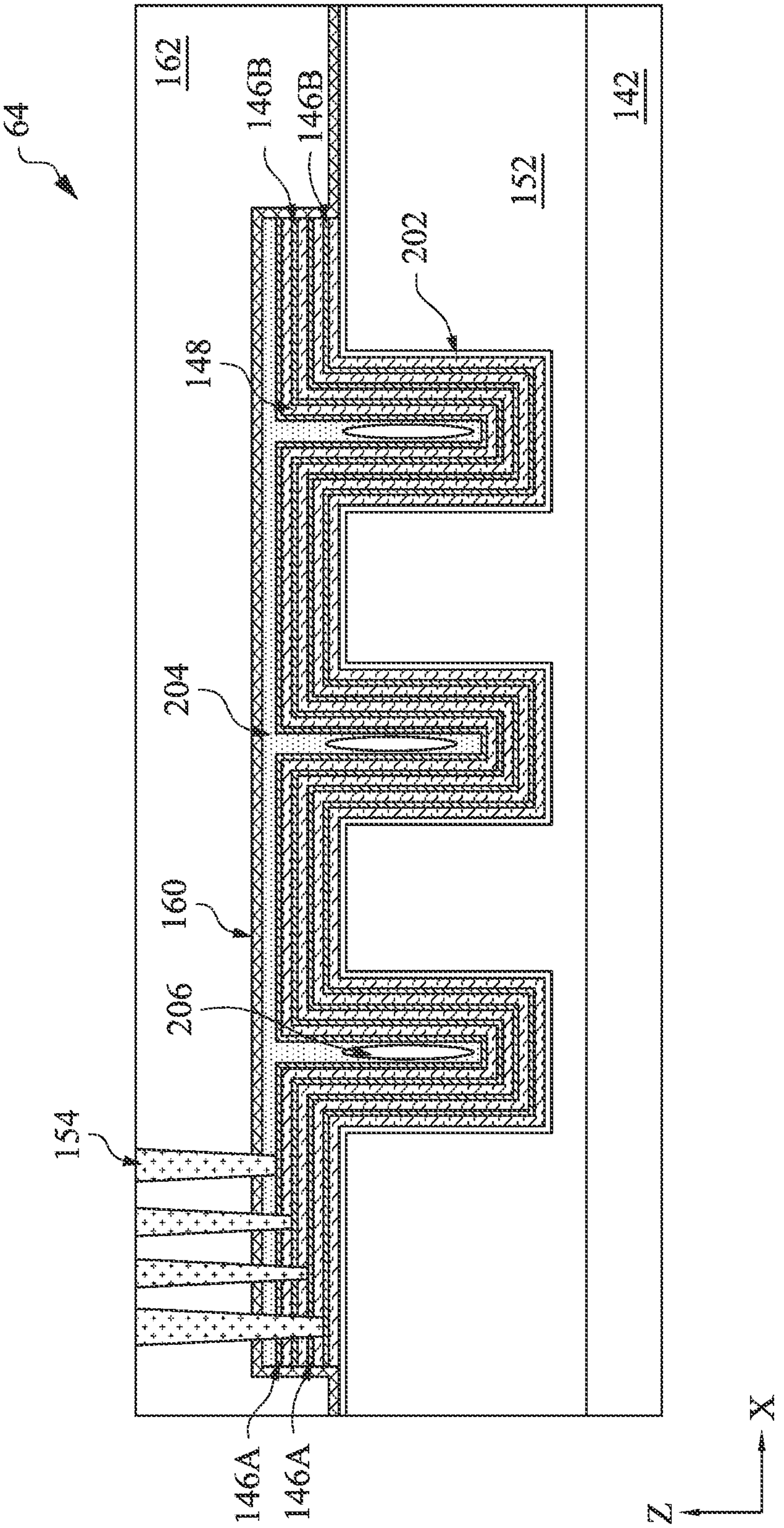

Referring to FIG. 10D, the conductive plugs 154 are formed in the via holes 166 by a suitable procedure, such as a procedure including depositions and CMP. The hard mask 164 may be removed by the CMP or an etch process before, after or during the formation of the conductive plugs 154. It is noted that each conductive plug 154 is intended to connect to desired conductive layer 146 but may have short issues to the intervening conductive layer(s) 146. Therefore, the conductive plugs 154 are designed with a dielectric material surrounding sidewalls thereof to eliminate the short issues. The formation of the conductive plugs 154 is designed to have multiple conductive material layers to address other issues, such as peeling issues, packing density, and other issues. The formation of the conductive plugs 154 is further described below.

In some embodiments, a dielectric material layer is formed on sidewalls of the via hole 166 and is absent from the bottom surface of the via hole. As known from the above description, the conductive layer 146 is exposed from the bottom surface of the via hole 166 and is intended to be connect to the conductive plug 154. Other conductive layers 146 above the intended conductive layer 146 are also exposed from the sidewalls of the via hole 166, those conductive layers 146 being referred to as intervening conductive layers 146. The dielectric material layer can effectively prevent the short issue of the conductive plug 154 to the intervening conductive layers 146. The formation of the dielectric material layer includes deposition and anisotropic etch, such as plasma etch, to remove the portions of the dielectric material layer deposited on the bottom of the via hole 166. The dielectric material layer includes one or more dielectric materials, such as silicon oxide, silicon nitride, other suitable dielectric material, or a combination thereof. The deposition method may include ALD, other suitable deposition, or a combination thereof. The dielectric material layer includes a thickness great enough to provide isolation function and thin enough without substantially impacting the opening dimension of the via hole 166. In the disclosed embodiment, the thickness of the dielectric material layer is less than 10 A, such as ranging between 5 A and 8 A.

In furtherance of the embodiments, a first metal-containing conductive layer is deposited in the via hole 166, especially on sidewalls of the dielectric material layer in the via hole 166. A second metal-containing conductive layer is deposited on the first metal-containing conductive layer within the via hole 166. The first and second metal-containing conductive layers are different from each other in composition. The first and second metal-containing conductive layers are designed to provide integration of the conductive plugs 154 to the dielectric material layer 162, such as adhesion, without using an existing barrier layer. For the existing barrier layer, if it is too thin, the existing barrier layer cannot provide good integration and may cause the peeling issue. If it is too thick, the existing barrier layer will reduce the aspect ratio of the via hole, and reduce the fill capability, may introduce defect of the conductive plug 154, such as void. In the disclosed embodiment, the first metal-containing conductive layer includes cobalt, nickel, other suitable metal, or a combination thereof. The first metal-containing conductive layer is deposited by ALD, other suitable deposition or a combination thereof. The first metal-containing conductive layer may include a thickness greater than 10 A, such as ranging between 10 A and 15 A. In some embodiments, the first metal-containing conductive layer may additionally or alternatively include titanium. The first metal-containing conductive layer functions as a glue layer to provide adhesion of the conductive plug 154 to the dielectric material layer 162. In the disclosed embodiment, the second metal-containing conductive layer includes an alloy of copper (Cu) and manganese (Mn), referred to as CuMn. The second metal-containing conductive layer is deposited by PVD, CVD, ALD, other suitable deposition or a combination thereof. The second metal-containing conductive layer may include a thickness greater than 10 A, such as ranging between 10 A and 20 A. In some embodiments, the second metal-containing conductive layer may additionally or alternatively include other suitable conductive material, such as titanium nitride or tantalum nitride.

Figure 11A:
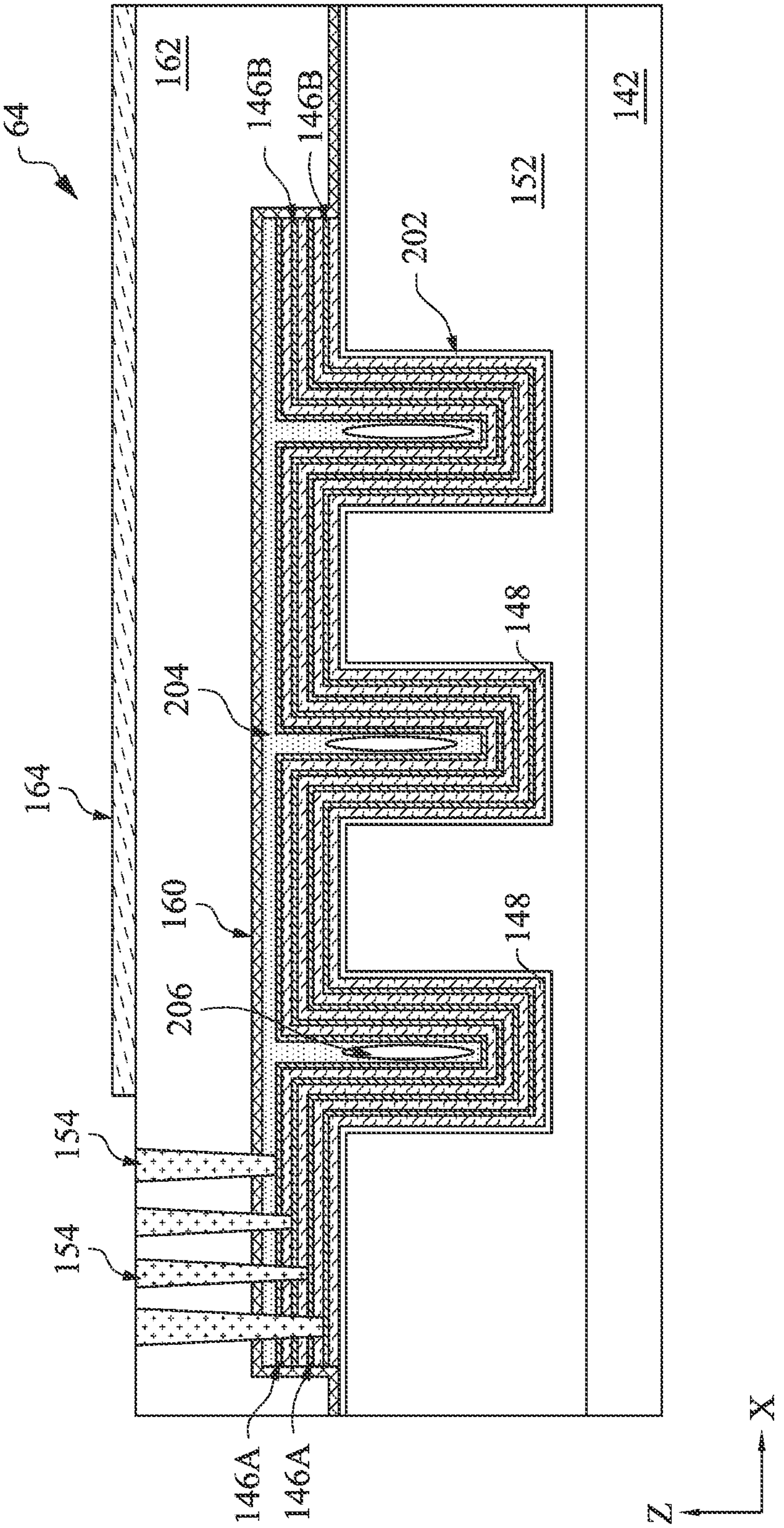
FIGS. 11A and 11B are sectional views of a deep trench capacitor structure constructed according to various embodiments of the present disclosure.
Figure 11B:
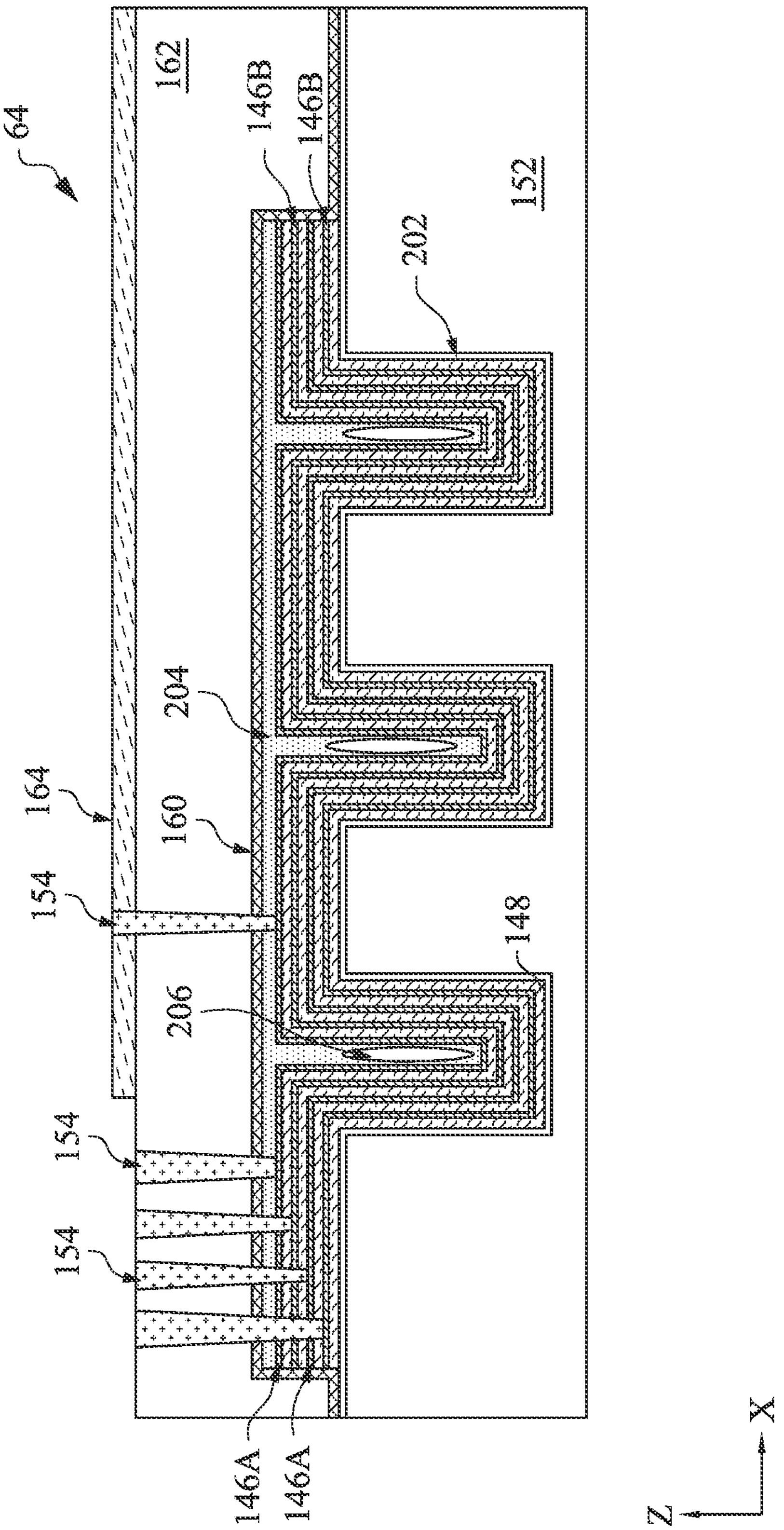

A fill metal layer is filled over the second metal-containing conductive layer in the via hole 166, thereby forming the conductive plug 154. The fill metal layer is different from the first and second metal-containing conductive layers in composition. The fill metal layer includes aluminum (Al), aluminum copper alloy (AlCu), tungsten (W), other suitable metal, or a combination thereof. The fill metal layer is filled over the first and second metal-containing conductive layers within the via hole 166 by a suitable process, such as hot flow process. In the hot flow process, the metal or alloy is heated to an elevated temperature so that the metal or alloy has a flowability and is deposited in the via hole 166 with enhanced filling capability and efficiency. The elevated temperature depends on individual metal or alloy. For example, if the fill metal layer is aluminum, the elevated temperature is greater than 350° C. In furtherance of the example, the metal (such as Al) is deposited by PVD when the workpiece is heated to a reflow temperature, such as a temperature between 350° C. and 550° C. during the PVD deposition. Afterward, a CMP process may be further applied to remove excessive deposited material and planarize the top surface. The conductive plugs may be formed in different configurations, such as those illustrated in FIGS. 11A and 11B, which are fragmentary sectional views of a DTC structure 64, in portion or entirety, constructed in accordance with some embodiments of the present disclosure.

Figure 12:
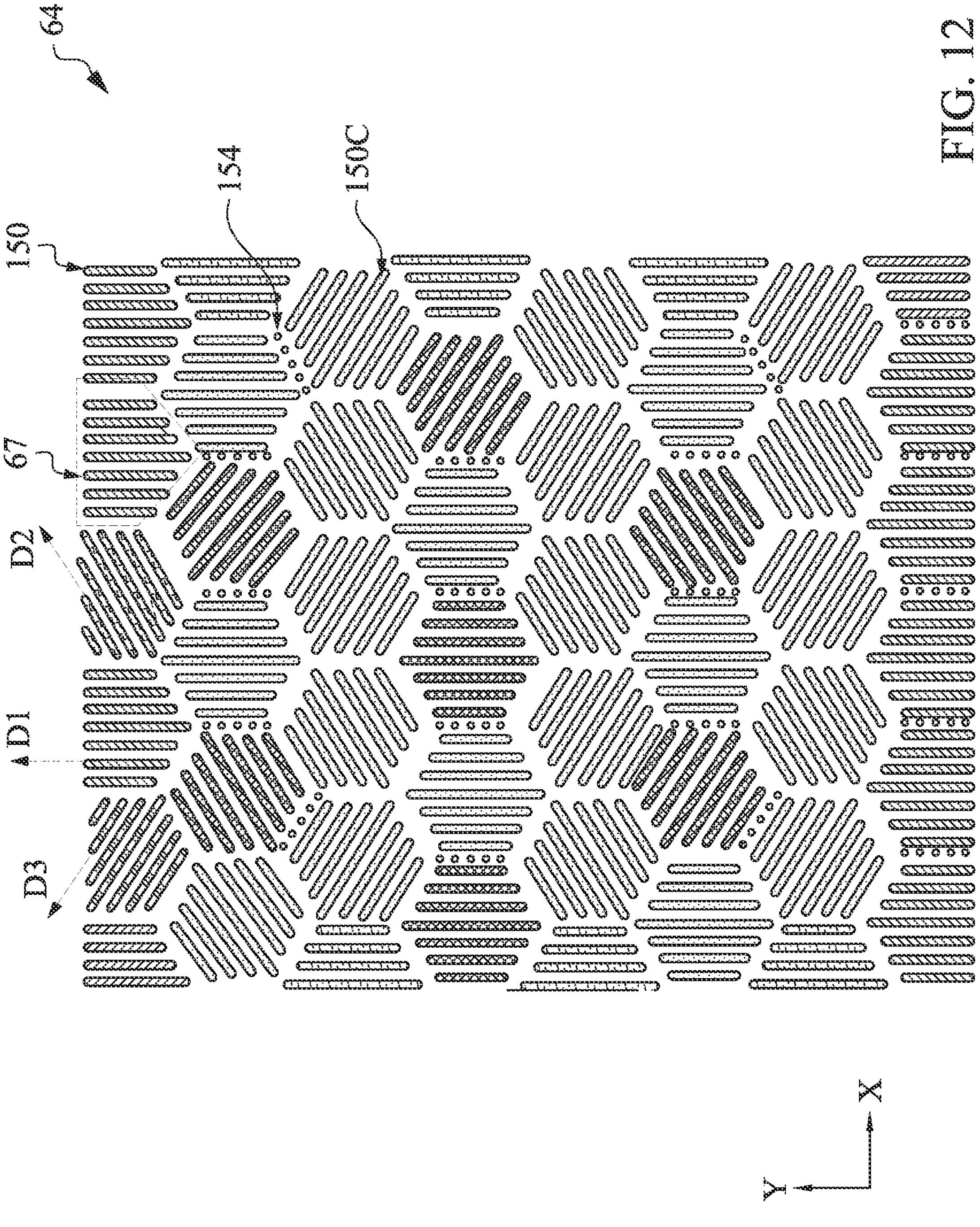
FIG. 12 is a top view of a deep trench capacitor structure constructed according to various embodiments of the present disclosure.

FIG. 12 is a fragmentary top view of a DTC structure 64 in portion or entirety, constructed in accordance with some embodiments of the present disclosure. The DTC structure 64 includes a plurality of DTC unit cells 67 configured into an array. The conductive plugs 154 are formed at gaps between the DTC unit cells 67. Particularly, the DTC unit cells 67 has different shapes, such as hexagons. In each DTC unit cell 67, the deep trenches 150 are oriented in a same direction. However, the deep trenches 150 in adjacent DTC unit cells 67 are oriented in different directions. Especially, the TDC structure 64 includes a first DTC unit cell with deep trenches 150 oriented along a first direction D1, a second DTC unit cell with deep trenches 150 oriented along a first direction D2, a third DTC unit cell with deep trenches 150 oriented along a third direction D3. Three directions D1, D2 and D3 are different from each other. For example, D1 is along Y direction, D2 is along a direction with 120 degree difference from D1, D3 is along a direction with 120 degree difference from D1 or D2. Furthermore, the deep trenches 150 in a DTC unit cell 67 span a different length, such as lateral deep trenches being shorter than the central deep trench 150C. A deep trench in a DTC unit cell 67 is shorter when it is more away from the central deep trench. The deep trenches 150 distributed on two sides of the central deep trench in one DTC unit cell 67 are symmetrically distributed. All deep trenches 150 are disposed with a same spacing between adjacent deep trenches in one DTC unit cell 67.

Figure 13A:
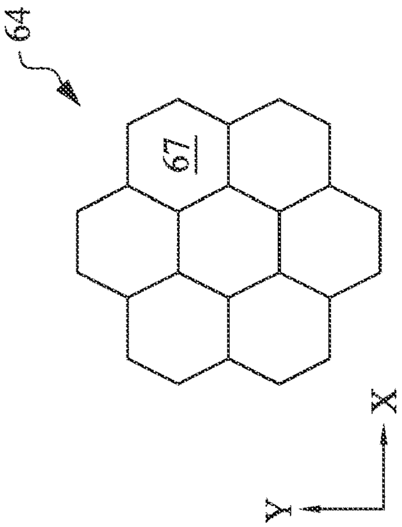
FIGS. 13A, 13B, 13C and 13D are top views of a deep trench capacitor structure constructed at various fabrication stages according to various embodiments of the present disclosure.
Figure 13B:
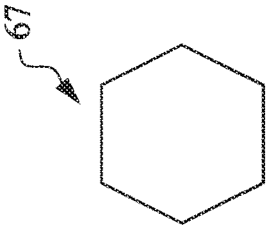
Figure 13C:
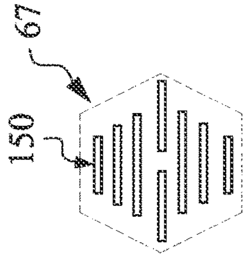
Figure 13D:
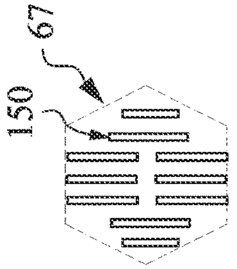

FIGS. 13A through 13D are fragmentary sectional views of a DTC structure 64, in portion or entirety, constructed in accordance with some embodiments of the present disclosure. FIG. 13A illustrates a DTC structure 64 having a plurality of DTC unit cells 67 each having a hexagon shape. FIG. 13B illustrates one DTC unit cell 67. FIGS. 13C and 13D illustrate deep trenches 150 in the DTC unit cell 67 in different configuration. The orientation of the deep trenches 150 in FIG. 13C is along X direction and the orientation of the deep trenches 150 in FIG. 13D is along Y direction. Particularly, the deep trenches 150 in one DTC unit cell 67 includes deep trenches 150 being not continuous, such as two deep trenches 150 are aligned along the longitudinal direction and are distanced away from each other with a spacing between.

Figure 14A:
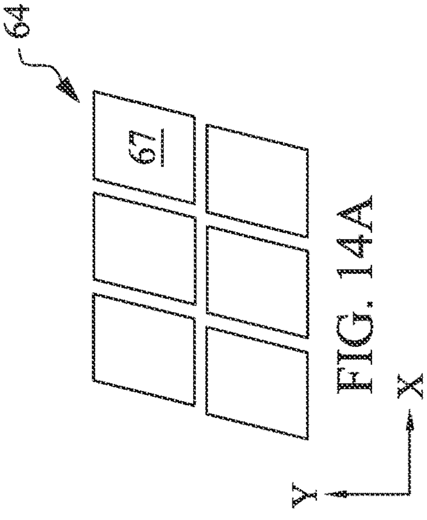
FIGS. 14A, 14B, 14C and 14D are top views of a deep trench capacitor structure constructed at various fabrication stages according to various embodiments of the present disclosure.
Figure 14B:
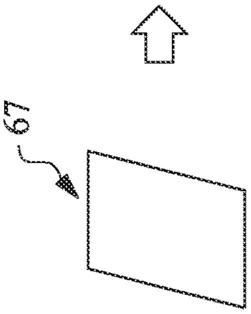
Figure 14C:
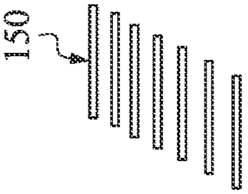
Figure 14D:
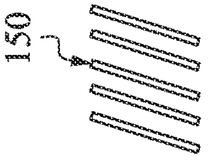

FIGS. 14A through 14D are fragmentary sectional views of a DTC structure 64, in portion or entirety, constructed in accordance with some embodiments of the present disclosure. FIG. 14A illustrates a DTC structure 64 having a plurality of DTC unit cells 67 each having a parallelogram shape. FIG. 14B illustrates one DTC unit cell 67. FIGS. 14C and 14D illustrate deep trenches 150 in the DTC unit cell 67 in different configuration. The orientation of the deep trenches 150 in FIG. 14C is along the direction parallel with the long edges of the parallelogram and the orientation of the deep trenches 150 in FIG. 14D is along the direction parallel with short edges of the parallelogram. Particularly, the deep trenches 150 in one DTC unit cell 67 includes deep trenches 150 that continuously extend and fully span between the opposite edges of the DTC unit cell 67.

The present disclosure provides a deep trench capacitor structure and a method making the same. The deep trench capacitor includes multiple conductive layers and dielectric layers alternatively stacked and connected through the conductive plugs to form an interleaved capacitor. Furthermore, the stack of the conductive layers and the dielectric layers is folded and inserted into one or more deep trenches. The conductive plugs are designed with multiple layers of metal and metal alloy to increase the adhesion and reduce the peeling issue of the fill metal of the conductive plugs. Additionally, a dielectric film of a compressive stress is further deposited in the deep trenches with voids formed therein. The dielectric film of a compressive stress compensates the tensile stress of the conductive layers of the stack inserted in the deep trenches and the voids further provide space to release stress. In some embodiments, the deep trenches in DTC unit cells are designed with different orientations, different pattern (such as broken deep trenches), and DTC unit cells are designed with different shapes, such as hexagon, parallelogram or other suitable geometry. All those spatial configurations collectively further reduce the stress. Though not intended to be limiting, embodiments of the present disclosure offer benefits for semiconductor processing and semiconductor devices. For example, the disclosed structure and method collectively reduce the stress and prevent the workpiece from warpage or other deformation.

In one example aspect, the present disclosure provides an embodiment of a method that includes patterning a substrate to form trenches; etching the substrate, thereby modifying the trenches with round tips; forming a stack including conductive layers and dielectric layers in the trenches, wherein the conductive layers and the dielectric layers alternate with one another within the stack; forming an insulating compressive film in the trenches, thereby sealing voids in the trenches; and forming conductive plugs connected to the conductive layers, respectively.

In another example aspect, the present disclosure provides an embodiment of a method that includes patterning a substrate to form deep trenches; etching the substrate, thereby modifying the deep trenches; forming a stack including conductive layers and dielectric layers alternatively stacked and folded in the deep trenches; and forming an insulating film in the deep trenches, thereby sealing voids in the deep trenches. The deep trenches are configured into a plurality of deep trench unit cells. The deep trenches in each of the deep trench unit cells are oriented in a same direction. The deep trenches in adjacent deep trench unit cells are oriented in different directions.

In yet another example aspect, the present disclosure provides an embodiment of a semiconductor structure that includes a plurality of deep trenches formed on a substrate; a stack of conductive layers and dielectric layers alternatively disposed in the plurality of deep trenches; and conductive plugs landing on the conductive layers, respectively. The deep trenches are configured into a plurality of deep trench unit cells. The plurality of deep trenches in each of the deep trench unit cells is oriented in a same direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

patterning a substrate to form trenches;

etching the substrate, thereby modifying the trenches with round tips;

forming a stack including conductive layers and dielectric layers in the trenches, wherein the conductive layers and the dielectric layers alternate with one another within the stack;

forming an insulating compressive film of a compressive stress in the trenches, thereby sealing voids in the trenches, wherein the voids are entirely enclosed within the insulating compressive film and are spaced from the conductive layers by the insulating compressive film; and forming conductive plugs connected to the conductive layers, respectively.

2. The method of claim 1, wherein the forming the insulating compressive film in the trenches includes performing an annealing process in an oxygen environment with annealing temperature ranging between 800° C. and 1200° C.

3. The method of claim 1, wherein the forming the insulating compressive film in the trenches includes forming at least one of a silicon oxide ($SiO_2$) layer, a silicon nitride layer, a polysilicon layer, a silicon carbide layer, and a combination thereof.

4. The method of claim 1, wherein the forming the insulating compressive film in the trenches includes performing a chemical vapor deposition process to form the insulating compressive film.

5. The method of claim 4, wherein the forming the insulating compressive film in the trenches includes forming at least one of a nitrogen-free anti-reflection layer (NFARL), a silicon oxide ($SiO_2$) layer, an undoped silica glass (USG) layer, a silicon carbide layer, and a combination thereof.

6. The method of claim 1, wherein the patterning the substrate to form the trenches includes forming a first hard mask having first openings on the substrate; and applying a first etching process to the substrate through the first openings of the first hard mask.

7. The method of claim 6, wherein the etching the substrate includes forming a second hard mask having second openings on the substrate; and applying a second etching process to the substrate through the second openings of the second hard mask, wherein the second openings of the second hard mask are different from the first openings of the first hard mask.

8. The method of claim 1, wherein the patterning the substrate to form the trenches includes patterning the substrate to form the trenches configured into a plurality of deep trench unit cells, wherein each of the deep trench unit cells includes a plurality of deep trenches longitudinally oriented in a same direction.

9. The method of claim 8, wherein the plurality of deep trench unit cells includes a first deep trench unit cell having first deep trenches longitudinally oriented along a first direction;

a second deep trench unit cell having second deep trenches longitudinally oriented along a second direction;

a third deep trench unit cell having third deep trenches longitudinally oriented along a third direction; and the first, second and third directions are different from each other.

10. The method of claim 9, wherein the first and second directions are oriented with 120° therebetween;

the second and third directions are oriented with 120° therebetween; and the third and first directions are oriented with 120° therebetween.

11. The method of claim 8, wherein each of the plurality of deep trench unit cells occupies an area having a shape of a parallelogram.

12. A method, comprising:

patterning a substrate to form deep trenches;

etching the substrate, thereby modifying the deep trenches;

forming a stack including conductive layers and dielectric layers alternatively stacked and folded in the deep trenches; and forming an insulating film of a compressive stress in the deep trenches, thereby sealing voids in the deep trenches, wherein the deep trenches are configured into a plurality of deep trench unit cells, wherein the deep trenches in each of the deep trench unit cells are oriented in a same direction, wherein the deep trenches in adjacent deep trench unit cells are oriented in different directions, and wherein the voids are entirely enclosed within the insulating film and are spaced from the conductive layers by the insulating film.

13. The method of claim 12, further comprising forming conductive plugs connected to the conductive layers, respectively, wherein the patterning the substrate to form the trenches includes forming a first hard mask having first openings on the substrate;

applying a first etching process to the substrate through the first openings of the first hard mask; and the etching the substrate further includes forming a second hard mask having second openings on the substrate, and applying a second etching process to the substrate through the second openings of the second hard mask, wherein the second openings of the second hard mask are different from the first openings of the first hard mask.

14. The method of claim 12, wherein the plurality of deep trench unit cells includes a first deep trench unit cell having first deep trenches disposed in a first region and longitudinally oriented along a first direction;

a second deep trench unit cell having second deep trenches disposed in a second region and longitudinally oriented along a second direction;

a third deep trench unit cell having third deep trenches disposed in a third region longitudinally oriented along a third direction; and the first, second and third directions are different from each other.

15. The method of claim 12, wherein each of the plurality of deep trench unit cells is shaped to one of a parallelogram and a hexagon; and the deep trenches in adjacent deep trench unit cells are not connected.

16. The method of claim 12, wherein the forming the insulating film in the deep trenches includes forming the insulating film of a compressive stress by performing an annealing process in an oxygen environment with annealing temperature ranging between 800° C. and 1200° C.

17. A method, comprising:

forming a first hard mask having first openings on a substrate;

applying a first etching process to the substrate through the first openings of the first hard mask;

forming a second hard mask having second openings on the substrate;

applying a second etching process to the substrate through the second openings of the second hard mask, thereby forming deep trenches, wherein the second openings of the second hard mask are different from the first openings of the first hard mask;

forming a stack including conductive layers and dielectric layers alternatively stacked and folded in the deep trenches; and forming an insulating film in the deep trenches, thereby sealing voids in the deep trenches, wherein the deep trenches are configured into a plurality of deep trench unit cells, wherein the deep trenches in each of the deep trench unit cells are oriented in a same direction, and wherein the deep trenches in adjacent deep trench unit cells are oriented in different directions, wherein the voids are entirely enclosed within the insulating film and are spaced from the conductive layers by the insulating film.

18. The method of claim 17, further comprising forming conductive plugs connected to the conductive layers, respectively, wherein the conductive plugs are configured in a line within a region between adjacent the deep trench unit cells.

19. The method of claim 17, wherein the plurality of deep trench unit cells includes a first deep trench unit cell having first deep trenches disposed in a first region and longitudinally oriented along a first direction;

a second deep trench unit cell having second deep trenches disposed in a second region and longitudinally oriented along a second direction;

a third deep trench unit cell having third deep trenches disposed in a third region longitudinally oriented along a third direction; and the first, second and third directions are different from each other.

20. The method of claim 17, wherein each of the plurality of deep trench unit cells is shaped to one of a parallelogram and a hexagon; and the deep trenches in adjacent deep trench unit cells are not connected.

* * * * *